US009310674B2

(12) United States Patent  
Azpiroz et al.

(10) Patent No.: US 9,310,674 B2  
(45) Date of Patent: Apr. 12, 2016

(54) MASK THAT PROVIDES IMPROVED FOCUS CONTROL USING ORTHOGONAL EDGES

(71) Applicant: International Business Machines Corporation, Armonk, NY (US)

(72) Inventors: Jaione Tirapu Azpiroz, Rio de Janeiro (BR); Alan E. Rosenbluth, Yorktown Heights, NY (US); Timothy A Brunner, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 262 days.

(21) Appl. No.: 14/185,440

(22) Filed: Feb. 20, 2014

(65) Prior Publication Data

US 2015/0234269 A1    Aug. 20, 2015

(51) Int. Cl.  
*G03F 1/76* (2012.01)

(52) U.S. Cl.  
CPC .................................... *G03F 1/76* (2013.01)

(58) Field of Classification Search  
CPC ........................................................ G03F 1/76  
See application file for complete search history.

(56) References Cited

U.S. PATENT DOCUMENTS

| | | | |
|---|---|---|---|
| 6,473,162 B1 | 10/2002 | Masaki et al. |
| 7,550,235 B2 | 6/2009 | Shi et al. |
| 7,620,930 B2 | 11/2009 | Van Den Broeke et al. |
| 7,703,069 B1 | 4/2010 | Liu et al. |
| 7,820,345 B2 | 10/2010 | Moon |
| 7,969,554 B2 | 6/2011 | Melville et al. |
| 8,037,429 B2 | 10/2011 | Shang et al. |
| 8,043,797 B2 | 10/2011 | Hansen |
| 8,108,802 B2 | 1/2012 | Rosenbluth et al. |

(Continued)

FOREIGN PATENT DOCUMENTS

| | | |
|---|---|---|
| CN | 101373326 B | 1/2012 |
| DE | 102005005102 B3 | 7/2006 |
| EP | 1804119 A1 | 4/2007 |
| JP | 10092706 A | 4/1998 |

OTHER PUBLICATIONS

Staals et al., "Advanced Wavefront Engineering for Improved Imaging and Overlay Applications on a 1.35 NA Immersion Scanner", Proc. of SPIE vol. 7973, 2011.

(Continued)

*Primary Examiner* — Stephen Rosasco  
(74) *Attorney, Agent, or Firm* — Harrington & Smith

(57) ABSTRACT

A method includes selecting a mask blank for lithographically forming a desired pattern of main features to be printed onto a wafer by projection lithography. First locations are identified in the desired pattern, the first locations being those which would produce on the wafer images impacted by phase distortions of actinic light through openings in the desired pattern. Second locations in the desired pattern are identified for the insertion of orthoedges. The orthoedges are provided to contribute an additional amplitude of actinic light to the images impacted by phase distortions when the actinic light is projected onto the wafer. The orthoedges are then inserted into the desired pattern at the second locations at orientations such that the orthoedges provide a quadrature component to the additional amplitude of actinic light having an opposite sign to the quadrature component of the actinic light producing the phase distortions. Finally, the mask blank is formed lithographically with the desired pattern modified through the insertion of the orthoedges.

40 Claims, 19 Drawing Sheets

(56) References Cited

U.S. PATENT DOCUMENTS

| | | |
|---|---|---|
| 8,108,806 B2 | 1/2012 | Robles et al. |
| 8,372,565 B2 | 2/2013 | Tian et al. |
| 2004/0131950 A1 | 7/2004 | Butt et al. |
| 2006/0216615 A1 | 9/2006 | Goldstein et al. |
| 2013/0019211 A1 | 1/2013 | Sakamoto et al. |
| 2013/0185046 A1 | 7/2013 | Bagheri et al. |

OTHER PUBLICATIONS

Azpiroz et al., "Massively-Parallel FDTD Simulations to Address Mask Electromanetic Effects in hyper-NA Immersion Lithography", Proc. of SPIE vol. 6924, 6240U (2008).

Azpiroz et al., "Incorporating Mask Topography Edge Diffraction in Photolithography Simulations", vol. 23, No. 4, Apr. 2006, J. Opt. Soc. Am. A.

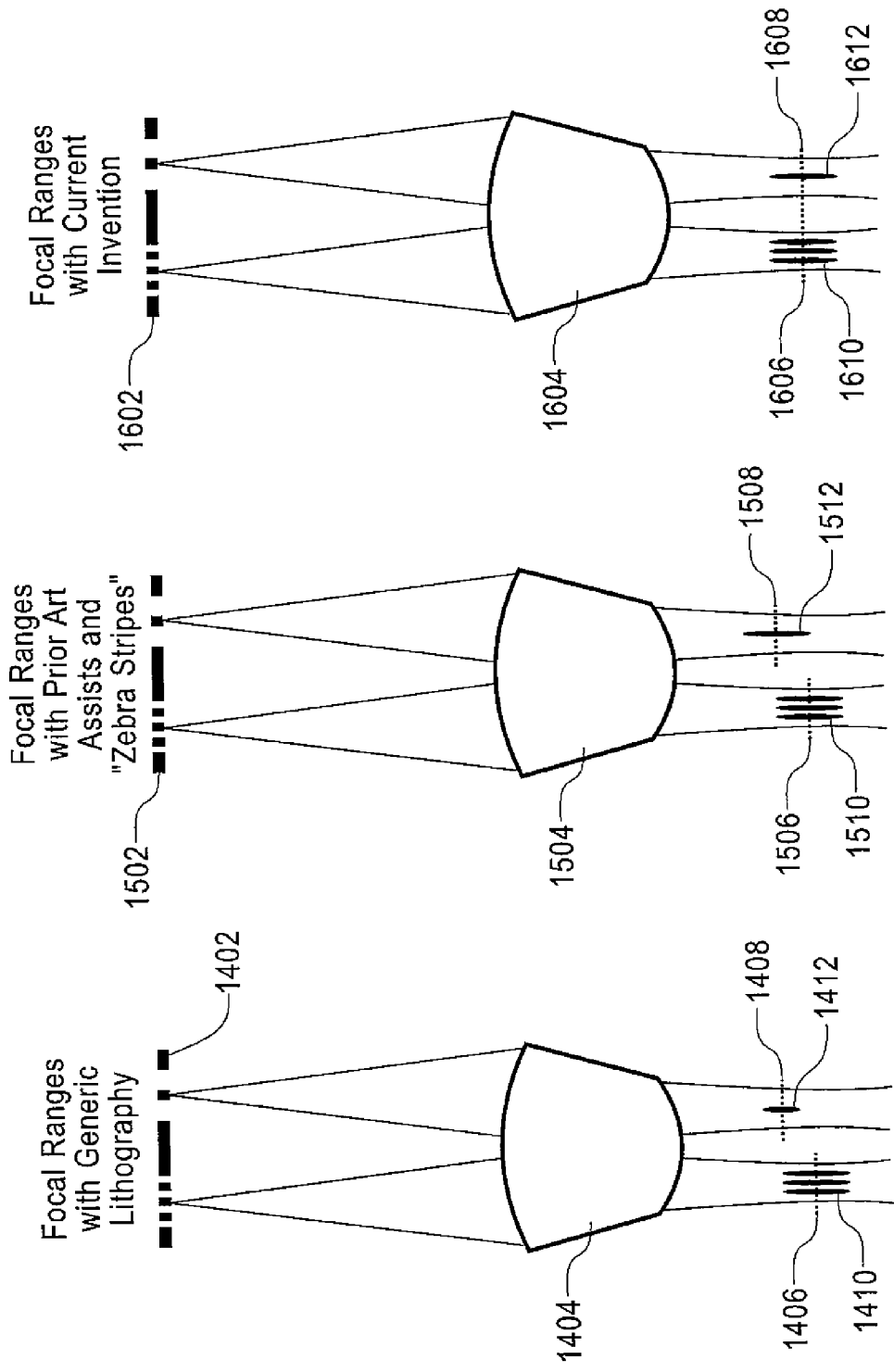

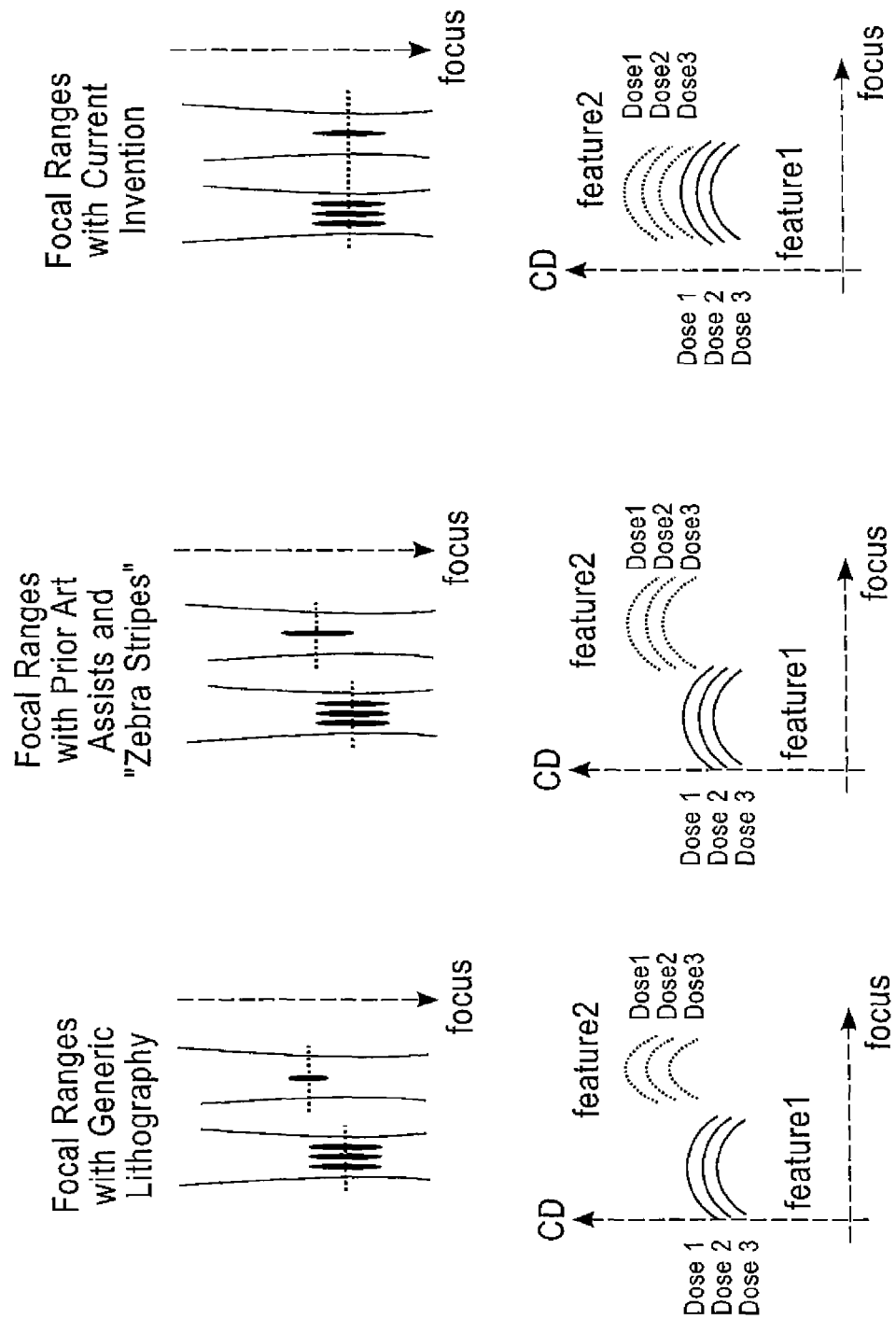

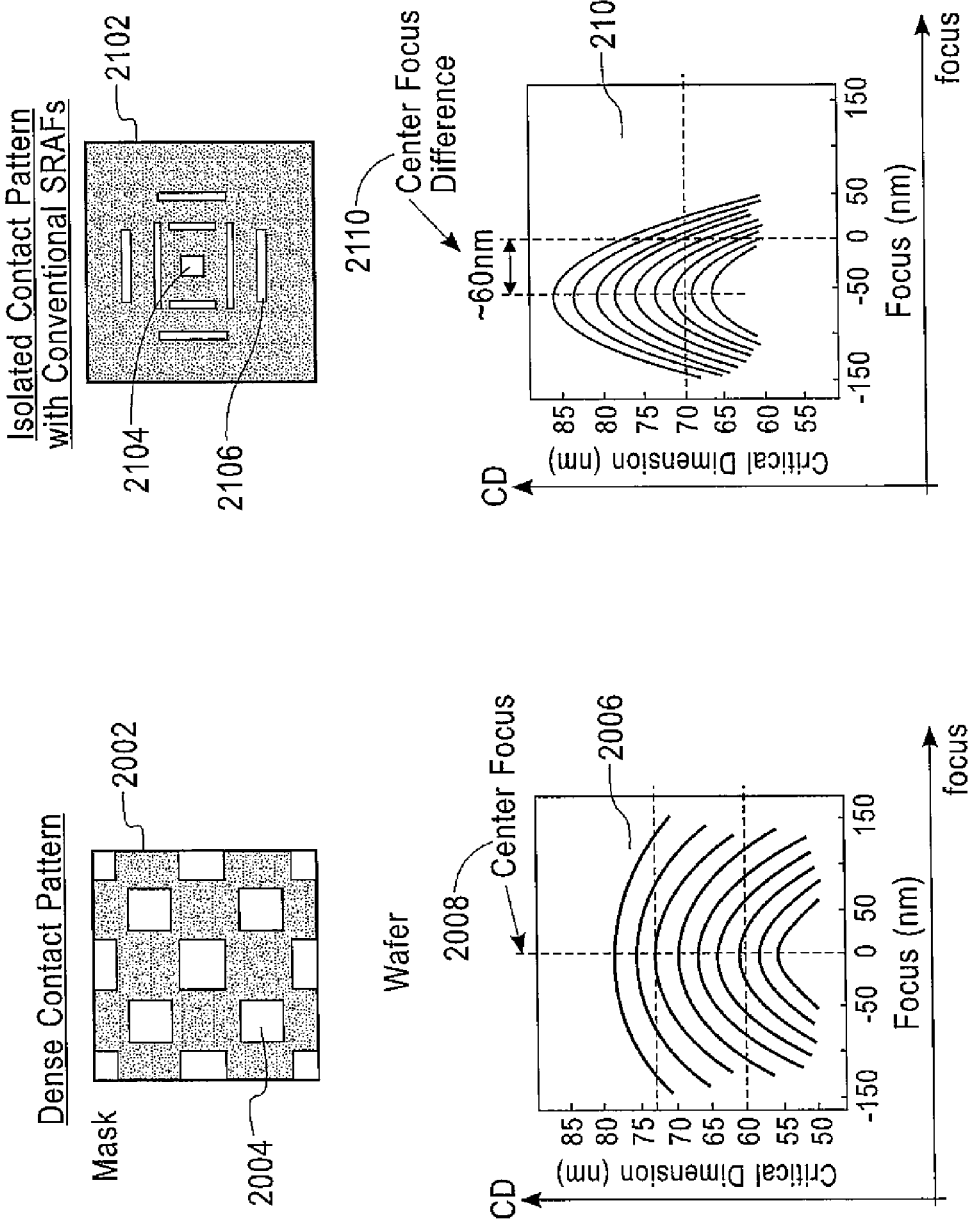

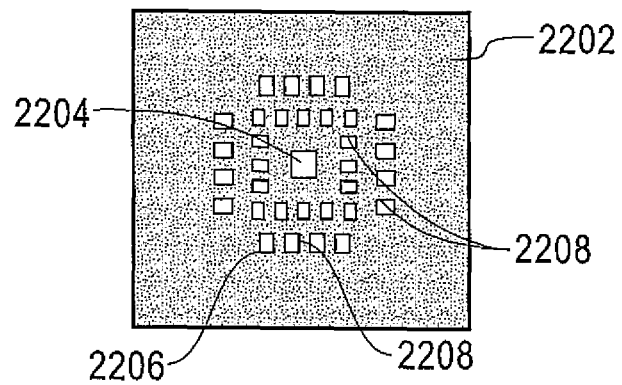
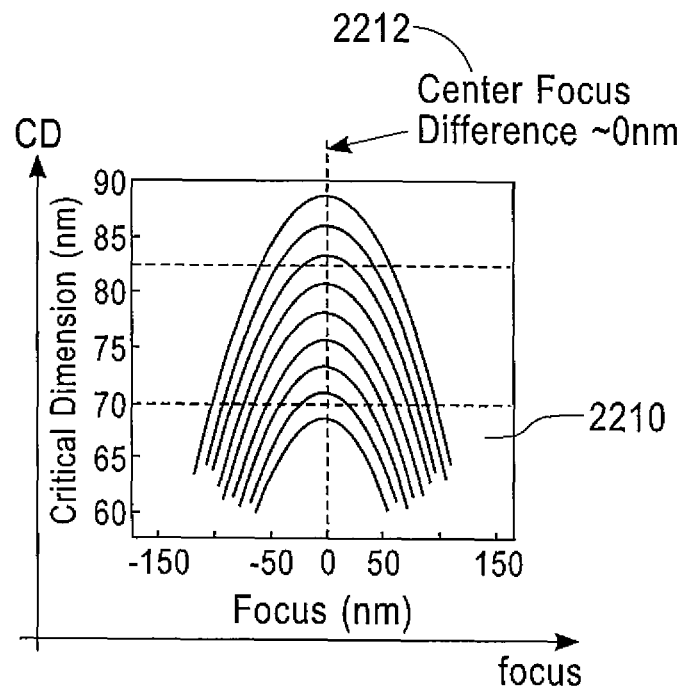
FIG. 22

Objective (basic example):
Maximize $\sum_{focus}$ { (darkest CD - ) - (brightest CD+ ) }
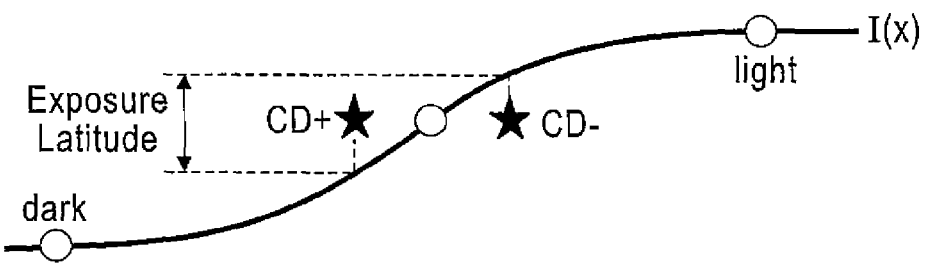
Sample Points
× : Edge
+ : CD - (allowed under-exposure)
+ : CD+ (allowed over-exposure)
○ : Light
○ : Dark
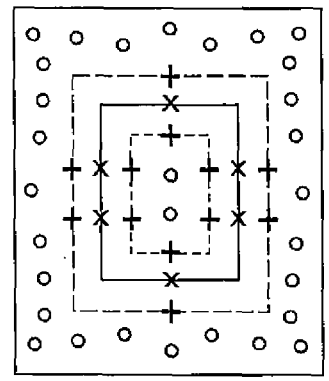
Target edge : ———
Allowed under-exposure : ----------
Allowed over-exposure : — — —
FIG. 24

MASK THAT PROVIDES IMPROVED FOCUS CONTROL USING ORTHOGONAL EDGES

TECHNICAL FIELD

This disclosure relates to the manufacture of semiconductor integrated circuits, and, more particularly, to masks used in the manufacture of such devices.

BACKGROUND

In a projection optical lithography system, a template of the desired circuit patterns is inscribed onto a 4-times (4×) enlarged reticle or photo-mask, which is then repeatedly illuminated with monochromatic actinic light, and the diffracted light imaged through a sophisticated optical system, and focused into a layer of light-sensitive photo-resist coated onto the surface of a silicon wafer. In optical lithography for microchip manufacturing, it is important that the focal ranges of all patterns in the layout be centered quite closely on a common plane in order to achieve a maximum common process window, since positioning errors and wafer non-flatness leave little focus margin with which to absorb shifts in the focused position of individual feature images. It is desirable, then, that all layout patterns be simultaneously in good focus within a plane at the midpoint of their focal ranges, and that this plane be common to all features. The focal range midpoint for a particular feature is referred to as the plane of best focus for that feature, and it is desirable that the best-focus planes of all patterns in the layout coincide with one another as closely as possible.

At present, very aggressive lithographic methods to print semiconductor technology nodes down to 10 nm using ultraviolet light of 193 nm wavelength are driving very small mask and wafer dimensions, as well as very tight process control requirements. At such a scale, variability specifications for focus, dose, overlay, and other factors are in the nanometer range for the most critical levels. For instance, the acceptable common depth of focus, measured as the range of focus over which every circuit pattern successfully prints within specs, for some of the most critical levels in typical 22 nm technology nodes, is of the order of 90 nm, becoming even tighter for 14 nm and 10 nm technology.

Relatively large shifts in the position of best focus have been observed on wafer for grating patterns of varying pitch and pattern type. These focus shifts can be traced back to phase errors induced by the transmission through subwavelength openings in the mask topography in the interfering beams that form the image intensity fringes at the wafer plane. In other words, the electromagnetic field scattering on the topography of the mask finite thickness results in changes in the phase of the diffracted orders, and these phase changes translate into shifts in the plane of best focus observed on wafer. These phase shifts are different for different mask patterns and can be responsible for shifts in focus that are as large as 60 nm in binary mask blanks commonly employed in lithography [Ref: J. Tirapu-Azpiroz, G. W. Burr, A. E. Rosenbluth, and M. Hibbs. "Massively-parallel FDTD simulations to address mask electromagnetic effects in hyper-NA immersion lithography." Proc. SPIE 6924, 69240Y (2008)]. In particular, large shifts in positions of best focus have been observed between very dense pitches and more isolated features. The distortions in the transmitted electromagnetic field that the topography of finite-thickness masks introduces are generally referred to as "EMF effects".

When circuit features on masks are large compared to the exposing wavelength, it can be convenient to approximate the mask as an ideally thin diffracting screen. This standard approximation is referred to as the Thin Mask Approximation (TMA). However, even on the 4× enlarged masks that are typically used, circuit features today can be narrower than the exposing wavelength, and the mask design must take into account the fact that the patterns delineated on realistic masks will occupy an appreciable thickness along the optical axis, corresponding, for example, to the thickness of a patterned opaque mask film, with this topographical thickness of the patterns being almost comparable to their width in some cases. Because of the finite-thickness topography, physical masks do not behave precisely like ideal diffracting screens, and, in particular, the phase of the light that diffracts into different orders can be shifted.

Lithographic lenses converge the collected diffracted light to an image that ideally will be focused at the wafer. The curvature component of the directional variation in the phase of the light that converges to a particular printed feature on the wafer from different directions within the lens exit aperture defines the best-focus position of the feature. This curvature component is essentially the quadratic phase component of the converging directional distribution. The resolution of lithographic lenses is nowadays comparable to the separation between adjacent printed features, and the resolution functions of lenses also have long "tails" that extend quite far from the geometrical image point, so the distribution of light and associated phase that converges to any particular wafer feature will typically be influenced by the topography-induced phase shifts from all other features within an extended neighborhood surrounding the particular feature. This kind of finite-range dependence is customarily referred to as an optical proximity effect, and the range over which optical proximity effects between neighboring features are considered important is often referred to as an ambit, or as an optical diameter. Typical optical diameters are in the range of about 1 micron to 2 microns.

Overall, while these topography effects show a complex dependency on the mask and illumination characteristics, they can be understood in terms of deviations in the amplitude and phase of the diffracted fields as compared to those predicted by the thin mask approximation (TMA). Transmission losses in the mask beyond the TMA prediction are responsible for amplitude errors in the aerial image intensity, and can often be approximated with a simple bias applied to the mask edge to decrease the aperture size. Phase errors, on the other hand, tend to shift the position of best focus as explained above, and are difficult to correct with a simple uniform mask bias. In the idealized TMA model, the phase difference between diffracted orders from the mask that reach the wafer to form the aerial image is exactly zero or 180 degrees (neglecting pattern asymmetries for simplicity); hence this phase difference, as well as the aerial image field amplitude, is always a real valued number with no imaginary or quadrature component. In a realistic photomask with a finite thickness, the diffracted order fields emerging from the mask will experience different amounts of phase shift, and the relative phase difference between orders can be any value between 0 and 360 degrees. Similarly, the field amplitude of the aerial image produced by the interference of those diffracted orders will no longer be purely real valued, and will contain an imaginary or quadrature component responsible for the pattern-dependent shifts in focus observed at the image space.

More generally, any physical mechanism that gives rise to pattern-dependent variations in the plane of best focus can be detrimental to good process performance. Such variations result from several physical effects, such as: 1) mask topography in small mask features; 2) lens aberrations, some of which may be caused by lens heating; and 3) thin-film interference effects occurring within the resist film stack.

Adjustments applied to the lens within the exposure tool can be made to compensate for the impact of lens aberrations in the projection pupil. In addition, compensation for focus variations due to mask topography through deliberate introduction of lens aberrations in the pupil has been proposed, but such exposure-tool compensation schemes would merely provide global-only blanket mitigation of mask EMF-effects, making it difficult to fine-tune the corrections on a pattern-by-pattern basis or to take pattern proximity into account. [Ref: F. Staals et al., "Advanced wavefront engineering for improved imaging and overlay applications on a 1.35 NA immersion scanner," SPIE v. 7973 (2011): p. 79731G.]

Compensating for the undesired phase shifts induced by mask topography with new added features, known as Anti-Boundary Layers, on the mask has also been proposed. The Anti-Boundary-Layer method corrects EMF effects by adding a compensating phase-shifter strip along mask edges. In order to create the phase-shifter strip, the mask quartz is etched to a predetermined optimum depth and along a predetermined optimum width, both parameters requiring careful control in three dimensions.

SUMMARY

According to the present invention, a method comprises selecting a mask blank for lithographically forming a desired pattern of main features to be printed onto a wafer by projection lithography. The method further comprises identifying first locations in the desired pattern. The first locations are locations which would produce on the wafer images impacted by phase distortions of the actinic light directed through openings in the desired pattern during projection lithography. The phase distortions may be induced, for example, by the transmission of the actinic light through the openings, which may, for example, be subwavelength openings, meaning that a dimension of the openings is smaller than the wavelength of the actinic light being used.

The method further comprises identifying second locations in the desired pattern for the insertion of orthoedges. The orthoedges are provided to contribute an additional amplitude of actinic light to said images impacted by phase distortions when said actinic light is projected onto said wafer, and inserting the orthoedges into the desired pattern at the second locations at orientations such that the orthoedges provide a quadrature component to the additional amplitude of actinic light having an opposite sign to the quadrature component of the actinic light producing the phase distortions.

Finally, the present invention further comprises forming the mask blank lithographically with the desired pattern modified through the insertion of the orthoedges. In practice, patterns on masks are actually formed lithographically, with the final transfer into the mask film usually being carried out with a dry etch.

The present invention is expected to be compatible with any mask fabrication method that forms the patterns as polygonal transmitting regions having sidewalls that scatter amplitude whose quadrature component has a polarization dependence that is at least comparable to the phase distortion being corrected.

According to another aspect of the present invention, an apparatus comprises one or more processors, and one or more memories including computer program code. The one or more memories and the computer program code are configured, with the one or more processors, to cause the apparatus to perform the method described above.

According to yet another aspect of the present invention, a computer program product comprises a computer-readable storage medium bearing computer program code embodied therein for use with a computer, the computer program code comprising code for performing the method described above.

According to still another aspect of the present invention, a mask for use in lithographically forming a desired pattern of main features on a wafer by projection lithography, said mask comprises a plurality of main features in the form of openings through which actinic light is directed during projection lithography. The openings have a plurality of first locations producing on the wafer images impacted by phase distortions of the actinic light. The openings further have a plurality of second locations with orthoedges. The orthoedges are provided to contribute an additional amplitude of actinic light to the images impacted by phase distortions. The orthoedges are at orientations providing a quadrature component to the additional amplitude of actinic light having an opposite sign to the quadrature component of the actinic light producing the phase distortions.

BRIEF DESCRIPTION OF THE DRAWINGS

The foregoing and other aspects of these teachings are made more evident in the following detailed description, when read in conjunction with the attached drawing figures.

FIG. 7, which comprises

FIG. 14 is a highly schematic view showing a mask of FIG. 13 with "Feature 1" and "Feature 2" without assist features being projected in the direction of a wafer (not shown) using standard lithographic practice.

FIG. 15 is a highly schematic view showing a mask of FIG. 13 with "Feature 1" and "Feature 2" when either conventional assist features or other gray scale mask features are added to the mask shapes of isolated patterns.

FIG. 16 is a highly schematic view showing a mask of FIG. 13 with "Feature 1" and "Feature 2" having the orthoedges of the present invention being projected in the direction of a wafer (not shown) using standard lithographic practice.

FIG. 17 illustrates in a highly schematic way the focal ranges for "Feature 1" and "Feature 2" of FIG. 13 using standard lithographic practice.

FIG. 18 illustrates in a highly schematic way the focal ranges for "Feature 1" and "Feature 2" when either conventional assist features or other gray scale mask features are added to the mask shapes of isolated patterns.

FIG. 19 illustrates in a highly schematic way the focal ranges for "Feature 1" and "Feature 2" when the orthoedges of the present invention are added to the mask shapes.

FIG. 20 illustrates a simple two-dimensional pattern formed by densely and regularly spaced contact shapes.

FIG. 21 illustrates an example of a 2-dimensional isolated contact mask pattern comprising a main contact feature and a set of conventional assist features.

FIG. 22 illustrates the example of FIG. 21 where orthoedges have been applied and optimized for good lithographic performance.

FIG. 24 shows how an optimization problem for EMF-aware SMO can be formulated using intensities at different sample points on a wafer, according to an embodiment of the invention.

DETAILED DESCRIPTION

Figure 1:
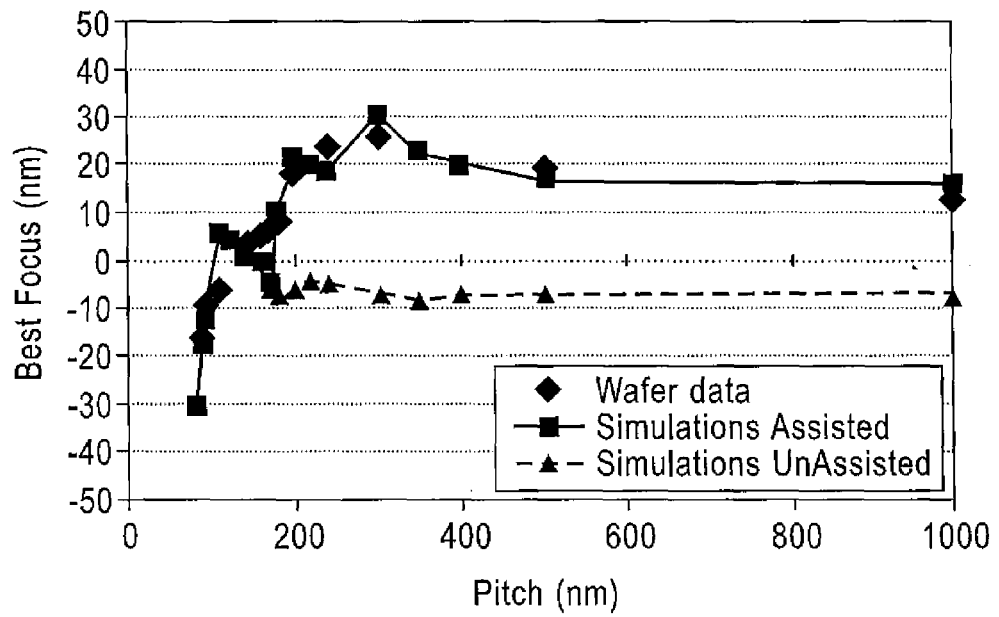
FIG. 1 is a plot which illustrates an example of the pattern-dependent focus shifts which are addressed by the present invention.

Turning now to these figures, FIG. 1 is a plot which illustrates an example of the pattern-dependent focus shifts which are addressed by the present invention. By pitch, which may be measured in nanometers (nm), is meant the linear density or spacing between features being projected onto a wafer by actinic light passing through a mask. On the vertical axis of the plot is the relative position of best or center focus on a nanometer scale. The plot includes rigorous electromagnetic simulations of the position of best focus (solid line and dotted lines), as well as measured values of best focus using photoresist data at the wafer plane (diamonds). As may be seen, there is a significant shift amounting to approximately 60 nm in the position of best focus through a range of pitch. The practical effect of the plotted variation is that features being projected onto a wafer from the mask may not be adequately focused at the wafer surface, and this difficulty is compounded by the fact that the wafer surface cannot be kept perfectly flat, or perfectly positioned. In particular, for pitches less than about 300 nm, the center focus varies over a wide range of focal distances. In other words, there is no single setting where all features will be in optimal focus. As the trend in recent years has been for these features to approach ever more closely to the limit of resolvability, the acceptable deviation from optimal focus becomes smaller and smaller, so this phenomenon presents a serious difficulty for chip manufacturers. If random positioning errors and pattern dependent focus shifts combine in such a way as to exceed the small range of acceptable focus deviations at some point in the exposed circuit pattern, the local pattern will fail to print acceptably.

In general, a pattern's plane of best focus will shift whenever the imaging wave suffers a phase distortion that is partly compensated by the phase curvature of lens refocus. In accordance with the present invention, pattern-dependent focus shifts induced by the topography of the mask are corrected by controlling the focus through the introduction of orthogonal mask edges to the mask shapes. Phase shift induced by mask topography depends on the orientation of mask edges relative to the polarization of the incident wave. The position of the plane of best focus at the wafer for a particular feature edge therefore depends on the orientation of all feature edges in the optical proximity neighborhood of the particular feature edge, and also on the relative position and size of the neighboring features, with the closest edges usually contributing the strongest effect. Close edges include the various segments of the particular feature edge itself, and may include the edges of nearby features of the so-called assisting type, also known as SRAFs (short for Sub-Resolution Assist Features). SRAFs are commonly used in masks to increase the amount of light that diffracts into directions which converge on the wafer with a large depth of focus, but these assist features do not produce an image themselves on the wafer, or, in the parlance of those of ordinary skill in the art, do not "print". To achieve the desired diffractive concentration, the assist features are preferably located in positions that interfere constructively with light diffracted from the associated main feature. In other words, assists are preferably positioned so as to contribute added amplitude in unison to the main feature. This means that the phase of the light contributed to a main feature image by the topography of main feature mask edges and associated assist feature edges will typically be shifted in unison within each direction that converges to the main feature image from the lens aperture, bearing in mind that main feature edges and associated assist feature edges in prior art masks will conventionally share a common orientation. Since the curvature component of the directional variation in the phase of the converging image light can represent a shift in focus, the distortions contributed by mask topography from conventional assists and from feature edges will typically contribute in unison to a shift in focus, thereby increasing the magnitude of the focus shift. Also plotted in FIG. 1 are the results of rigorous electromagnetic simulations of the position of best focus, both with assist features (solid line), and without assist features (dotted line). These are shown for the same set of mask patterns for which measurements of best focus in photoresist are also plotted (as diamonds). The plot shows that mask topography in sub-resolution assist features (SRAFs) can be the cause of most of the focus shift. The solid line plot in FIG. 1, which are simulations of features having a range of pitch and either no, one, two, three or four SRAFs, show that SRAFs often appear to cause most of the focus shift observed as pitch varies, especially when compared to the dashed line, which corresponds to the case where no mask pattern includes SRAFs. When prior art SRAFs are deployed, one effect of the assist feature edges is to contribute in unison a substantial quadrature phase component to the printed main feature, which can significantly shift the plane of best focus.

According to the method of the present invention, new edges, generally sub-resolution, are introduced into mask shapes. The new edges are orthogonally oriented relative to the associated feature edge, in order to control the phase/focus shift suffered by features in the same optical proximity neighborhood when printed on the wafer. The compensation mechanism is that the phase shift, obtained with state-of-the-art mask blank choices, shows sign reversal as polarization changes. More precisely, the quadrature component of the complex-valued field diffracted by the mask topography at a feature edge will reverse sign when the orientation of the mask edge is rotated by 90 degrees relative to the polarization of the incident wave. As a consequence, the phase distortions which shift the focus of a particular edge can be canceled out by deployment of the orthogonal edges.

Expressed more concisely, in accordance with the present invention small orthogonally oriented edges are inserted into the mask at locations where the resulting compensating quadrature amplitude can cancel phase distortions that would otherwise be present in the image. These orthogonally oriented edges may be referred to herein as "orthoedges". Since assist features are positioned so as to interfere constructively with associated main features, the orthogonally oriented edges may be located in assist features. The detailed lengths of the orthogonal edges and the lengths of the edge segments that connect to them can be treated as parameters, and suitable cancellation of phase distortions can then be established by adjusting these parameters via simulation of the images produced on wafer, as will be discussed. Since orthoedges are usually inserted into the perimeter of features which have already been positioned on the mask in order to print as circuit features or to assist in the printing of circuit features, the adjustment step will only be able to change the position of the inserted orthoedges to a limited degree. It is therefore preferable that the orthoedges be initially placed at locations that interfere in unison at main feature image locations. Adjustment by itself cannot generally be relied upon to provide focal plane equalization if the starting positions and lengths of the orthoedges are poorly chosen, even when the adjustment is guided by an optimizer, as in Source-Mask Optimization (SMO).

Figure 2:
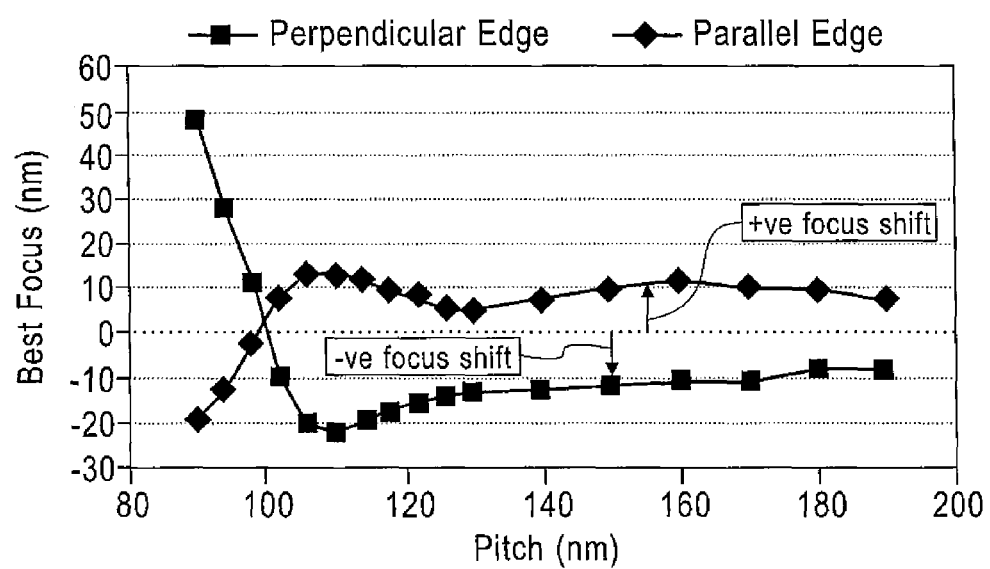
FIG. 2 is a plot showing that the best focus value depends on the orientation of the mask edge relative to the polarization of the incident wave.

The impact of the conventional uniform alignment of feature edges and assist edges that obtains in standard masks is illustrated in FIG. 2, which is a plot showing that the best focus value depends on the orientation of the mask edge relative to the polarization of the incident wave. FIG. 2 was obtained from rigorous electromagnetic simulations of the position of best focus for a set of gratings with varying pitch and mask size etched on an attenuated phase shifting mask illuminated with a dipole source pupil configuration and two orthogonal polarizations, one parallel and one perpendicular to the mask grating edges.

The present invention corrects for phase distortion by adding new edges, generally sub-resolution, to the mask, in order to introduce phase shifted light whose quadrature component has the opposite sign at the print locations of each main feature edge. Image simulation may be used to tune the locations and lengths of the orthoedges throughout the neighborhood of each feature edge in order to achieve this overall balance at each edge as closely as possible, and these simulations may be embedded in optimization loops. Since the orthoedges are sub-resolution they do not print as artifacts in the printed pattern, but they nonetheless can influence the image in other respects besides focal position. For this reason the image simulations are preferably used to maintain image quality in terms of standard lithographic metrics such as contrast, exposure latitude, Mask Error Enhancement Factor (MEEF), and depth of focus, while at the same time maintaining focus alignment. A wide variety of positions are available at which to insert the orthoedges, allowing the orthoedges to impact a great many degrees of freedom in the phase profile of the directional distribution of light that converges to focus on each feature edge from across the aperture of the lens. Orthoedge control is therefore not limited to adjusting the defocus component of the converging beam (this defocus component essentially being the quadratic phase curvature component), meaning that orthoedge phase correction can be more general than merely removing the defocus component, and can alternatively or in addition be used to mitigate other phase aberrations that are known to affect the image.

In embodiments addressing focus control, the result is a much smaller range of best focus values across pitches, both assisted and un-assisted. As will be shown below, assisted pitches, that is, pitches having SRAFs, may preferably have the so-called orthoedges only on the SRAFs. Dense, unassisted pitches may have orthoedges on the main feature. The focus spread for assisted only pitches has been seen to be virtually eliminated, as will also be shown below.

The present invention applies to different mask types, such as MoSi Atten PSM (molybdenum silicide attenuated phase shift masks), OMOG (opaque MoSi on glass), and thinOMOG mask blanks (opaque MoSi on glass using films with reduced thickness), and mask correction is applied only on the plane of the mask, in two dimensions, and does not require changes to the mask-making process.

The phase correction can be more general than merely removing the defocus component and, moreover, the present method can also be used to compensate for focus shifts and phase distortions induced by other physical processes in the lithographic optical path in addition to mask topography, such as lens aberrations. The present method also enables the compensation of higher order forms of phase distortion, in addition to the phase curvature component represented by defocus.

Figure 3:
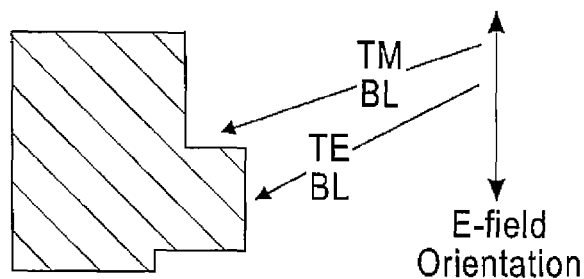
FIG. 3 is a schematic view of so-called boundary layers in orthogonal directions relative to one another and parallel and perpendicular to the E-field orientation of an incident wave.

The approach of the present invention, then, is to seek local phase compensation. Referring to FIG. 3, a schematic view of so-called boundary layers in orthogonal directions relative to one another and parallel and perpendicular to the E-field orientation of an incident wave, the appropriately oriented boundary layer (BL) potentially serves as a source of compensating phase shift, providing initial values for orthoedge layout parameters, with the BL properties being a function of the material from which the mask is made. In this regard, investigation has shown that the departure of a finite-thickness mask from the thin-mask ideal can be approximately modeled by regions of perturbed transmission along mask edges, which are the so-called boundary layers [Ref: J. Tirapu-Azpiroz, E. Yablonovitch. "Incorporating mask topography edge diffraction in photolithography simulations", J. Opt. Soc. Am. A, Vol. 23, No. 4, pp: 821-828 (2006).]. Further, boundary layer properties (for example, the product of effective width and transmission, w*T) depend on the orientation of a mask edge relative to the light polarization [Ref: J. Tirapu-Azpiroz, G. W. Burr, A. E. Rosenbluth, and M. Hibbs. "Massively-parallel FDTD simulations to address mask electromagnetic effects in hyper-NA immersion lithography." Proc SPIE 6924, 69240Y (2008).].

For example, for a so-called thinOMOG mask, w*T is approximately (6+5i) nanometers under TE polarization (E-field parallel to edge, as shown in FIG. 3), and about (5-4i) nm in the orthogonal TM polarization (E-field perpendicular to edge). The sign reversal in the quadrature amplitude component should be noted. By convention, phase origin is chosen to make the dominant TMA (thin-mask approximation) image amplitude real-valued at the geometrical focus, and the quadrature component is then represented by the imaginary part. Significantly, the imaginary part changes sign when the edge is rotated. The exact values of real and imaginary parts of the BL parameter (w*T) depend on the mask materials. However, the sign of the imaginary part changes with polarization for at least the three mask types mentioned above (OMOG, thinOMOG, MoSi Atten PSM).

As previously illustrated in FIG. 1, assist features (SRAFs) make a significant contribution to EMF-induced phase shift. Even when the edges of a main feature on a mask have no dominant x- or y-orientation, prior art masks may include assist features that are extended. In general, phase contributions from extended edges in main features or assist features can distort an image under either illuminating polarization. When different parts of the illuminating source have different polarization components, it can be desirable that the contributions made to the total image by each part of the source be made to share a common center of focus. On the other hand, it can sometimes be useful instead to spread these different contributions in a balanced and equal way about the mean focus plane, in order to increase focal range at the expense of contrast. In general, image simulation can be used to ensure that the parameters governing orthoedge deployment are tuned to provide the widest possible common focal range for the overall image.

Assist features (SRAFs) are preferably placed on a mask at locations of constructive interference with the main features to be printed on a wafer. As a result, the TE edges of the assist features will contribute a similar phase to the image being printed as do the TE edges of the main features, and likewise for the TM edges. In addition, small edges whose separation is less than the resolution of the lens being used to project the image being printed will essentially make a merged contribution to the image.

Of course, assist features must not print, meaning that they must not be wide enough to create a resolved image of themselves on a wafer, but otherwise their amplitude on wafer does not need to be finely set. Desired edge placement of printed patterns is primarily controlled by fine adjustment of main feature shapes on the mask.

Figure 4:
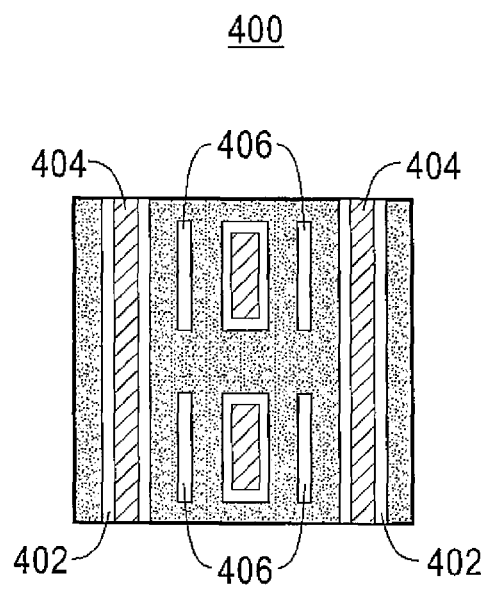
FIG. 4 is a schematic plan view of a portion of a mask of the prior art.

For the sake of illustrating the present invention, FIG. 4 is a schematic plan view of a portion of a mask 400 of the prior art. The mask 400 includes several integrated circuit (IC) shapes 402 designed to permit the passage of incident waves to print the corresponding features 404 on a wafer. IC shapes 402 are applied as stencil patterns on the mask blank with the dimensions of the final patterns being adjusted by means of optical proximity correction (OPC). Assist features (SRAFs) 406 are added to extend the focal range, although the focal ranges of features of different sizes generally cannot be aligned. "Main" features 402 are intended for transferring or printing in the photoresist, and conventional "assist" features 406, commonly consisting of long and narrow lines parallel to the main features, are not intended for transferring to the resist.

Figure 5:
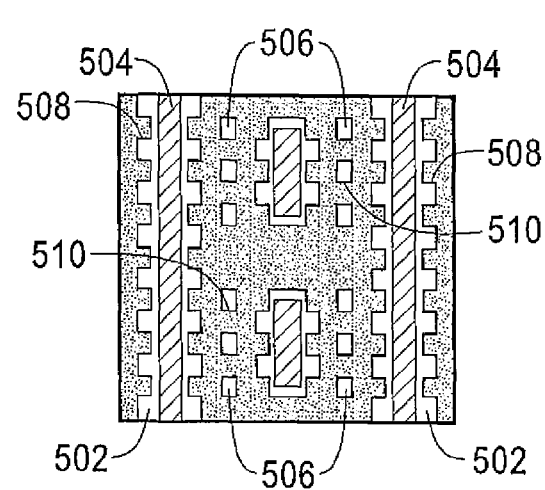
FIG. 5 is a schematic plan view of a portion of the mask of FIG. 4 modified in accordance with the present invention.

In the present invention, focus control is improved through the inclusion on mask shapes of orthogonal mask edges by introducing edges that are orthogonally oriented relative to the associated feature edge in order to control the phase/focus shift suffered by the main feature on wafer. Reference is now made to FIG. 5, a schematic plan view of a portion of a mask 500 for the sake of illustrating the present invention. As with FIG. 4, mask 500 is created using standard steps, and includes several integrated circuit (IC) shapes 502 designed to permit the passage of incident waves to print the corresponding features 504 on a wafer. Assist features (SRAFs) 506 are added to extend the focal range. In addition, short, orthogonally oriented edges 508 and 510 are then inserted into the patterns on the mask. These so-called orthoedges are short fragments, orthogonally-oriented relative to the associated feature edge inserted at regularly spaced locations and of size smaller than the lens resolution. The orthoedges are placed in locations where they can cancel phase distortions in the image, such as at the locations of assist features. Lengths may initially be chosen for the orthoedges, and for the edges that connect them, such that the local area of features is unchanged after the insertion of orthoedges, and such that the net local quadrature component is canceled according to a boundary layer model. Parameters are defined which specify the lengths of the orthoedges, and of the edges that connect to the orthoedges, as will be discussed. Image simulations and adjustments of these parameters are then carried out iteratively to reduce the separation between the focal ranges of the images of the mask features. These simulations can also be used to maintain quality in such standard lithographic metrics as ILS, DoF, and MEEF, with these metrics being, for example, maintained at levels consistent with the quality attained after adoption of assisting features prior to insertion of orthoedges. The simulations and adjustments may be controlled by standard optimization software, such as Source-Mask Optimization software, often referred to as SMO software. The SMO software may employ what is known as a zig-zag flow, in which minimization of focal spread initially serves as the objective of a first optimization, with other metrics like ILS, DoF, and MEEF being constrained to maintain preliminary quality levels during this first optimization, and then with subsequent flow steps carrying out optimizations in which the objective is switched to improvement of one of the previously constrained lithographic metrics like ILS, DoF, and MEEF, with focal range then serving as a constrained quantity. The result of these steps is that the focal ranges are brought into closer alignment.

It should be understood that the phase contributions from all edges in the optical proximity neighborhood of a feature must be in balance in order to achieve focal plane equalization. In addition, it will generally be the case that most edges are in the neighborhoods of many different feature edges simultaneously, and orthoedge sizing and placement, including critical initial placement, should preferably achieve the desired balancing within all such neighborhoods. In other words, equalization of focal planes is not an inherent feature in every mask that happens to include edges in both orientations. Actually, almost every prior art mask will include some edges that are perpendicular to other edges, and, in some cases, this character is extreme, as with zebra stripes. However, such prior art masks do not in general achieve focal plane equalization.

Figure 6:
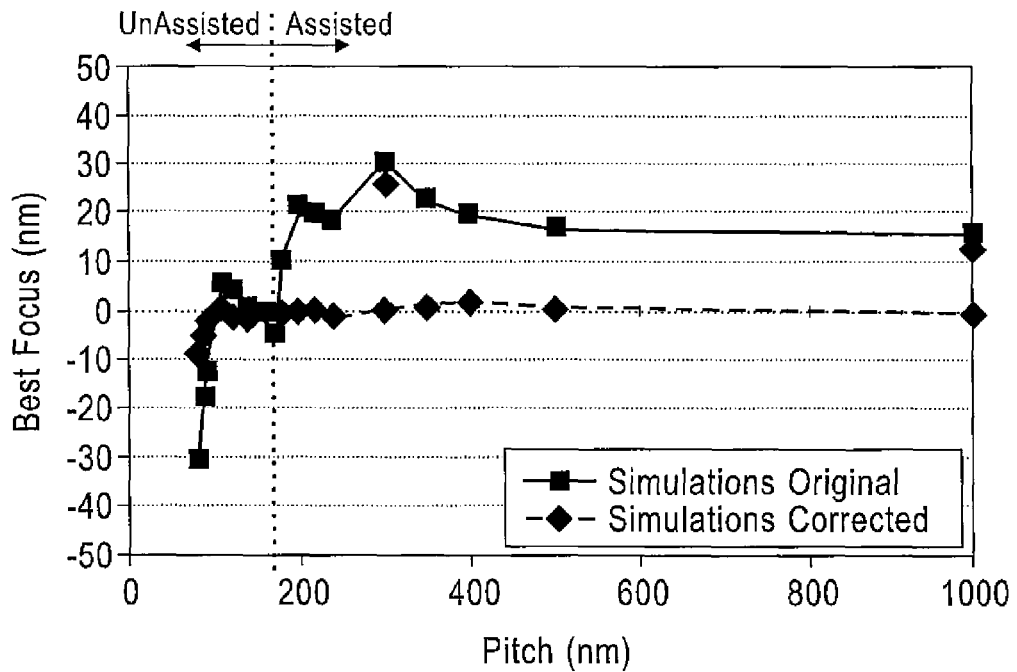
FIG. 6 is a plot of simulation results illustrating the alignment of the focal ranges of pitches of a wide range of sizes which follows from the practice of the present invention.

FIG. 6 is a plot of simulation results illustrating the alignment of the focal ranges of pitches of a wide range of sizes which follows from the practice of the present invention. The simulations are for the same set of gratings as were used to obtain the solid line in FIG. 1, and show the resulting position of best focus after introducing orthoedges on the mask shapes of the same gratings of FIG. 1. In the example plotted in FIG. 6, the assisted pitches, that is, pitches having SRAFs, are greater than approximately 180 nm and have orthoedges only on the SRAFs. Dense, unassisted pitches, less than approximately 180 nm, have orthoedges on the main feature. In general, the orthoedges of the invention are given an orientation perpendicular to the orientation of prior art mask edges. As shown in FIG. 6, the result is a much smaller range of best-focus values across pitches, including both assisted and unassisted. The focus spread for assisted-only pitches (greater than approximately 180 nm) is virtually eliminated. The size and location of the orthoedges in the mask is optimized to cancel phase distortions in the image and to bring focal ranges into alignment as seen by the smaller range of best focus values after applying orthoedges.

Figure 7A:
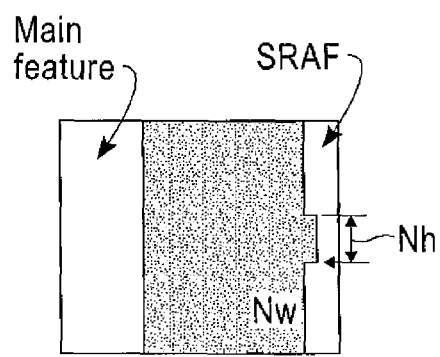
FIGS. 7A and 7B, shows various orthoedge parameters that can be controlled and optimized to tune the amount of phase compensation required to reduce focus shifts in the image.
Figure 7B:
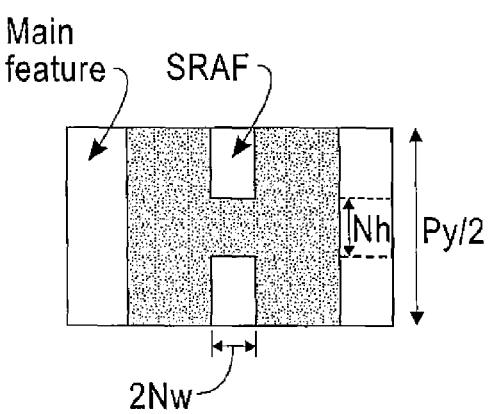

Referring now to FIG. 7, which comprises FIGS. 7A and 7B, in accordance with an exemplary embodiment of the present invention, orthogonal edges, also known as orthoedges, inserted in some cases by adding notches to mask patterns, are included on assist features (SRAFs) to control EMF-induced focus shifts. The notches themselves may be characterized by several parameters; notch width ($N_w$), notch height ($N_h$), and notch periodicity ($P_y$). The notch width is the distance by which the notch projects outward from the edge of the SRAF. The notch height is the distance by which the notch extends along the edge of the SRAF. The notch periodicity is the distance between one point on a notch to the corresponding point on the next notch. The distance separating one notch and the next notch is ($P_y - N_h$). The orthoedge parameters can be controlled and optimized to tune the amount of phase compensation required to reduce focus shifts in the image. The orthoedges can appear as indentations into the main feature or assist feature (A) or can be large enough to cut across the entire mask feature width (B).

A key step in the present invention is to tune orthoedge parameters via computer simulation and/or optimization, that is, source mask optimization (SMO), during which the source variables may be fixed as an option (with the method continuing to be referred to here as SMO in that case). In the tuning process, shot count can also be considered. The initial orthoedge deployment in a starting design is based on boundary layer (BL) balance and preservation of local assist transmission. Once the optimal orthoedge parameters are determined, for example, through pitch, assists are deployed across the layout via rules. Fast EMF models and/or calibrated process models are used to fine-tune feature critical dimensions (CDs) in the usual way, for example, via optical proximity correction (OPC) or mask optimization, thereby applying known methods to the new focus-controlled masks of the present invention. Referring to FIG. 7B, computer simulations have shown that "dashed SRAF" topologies, where the notches extend completely across the SRAFs, are particularly effective in equalizing best focus across patterns.

Figure 8:
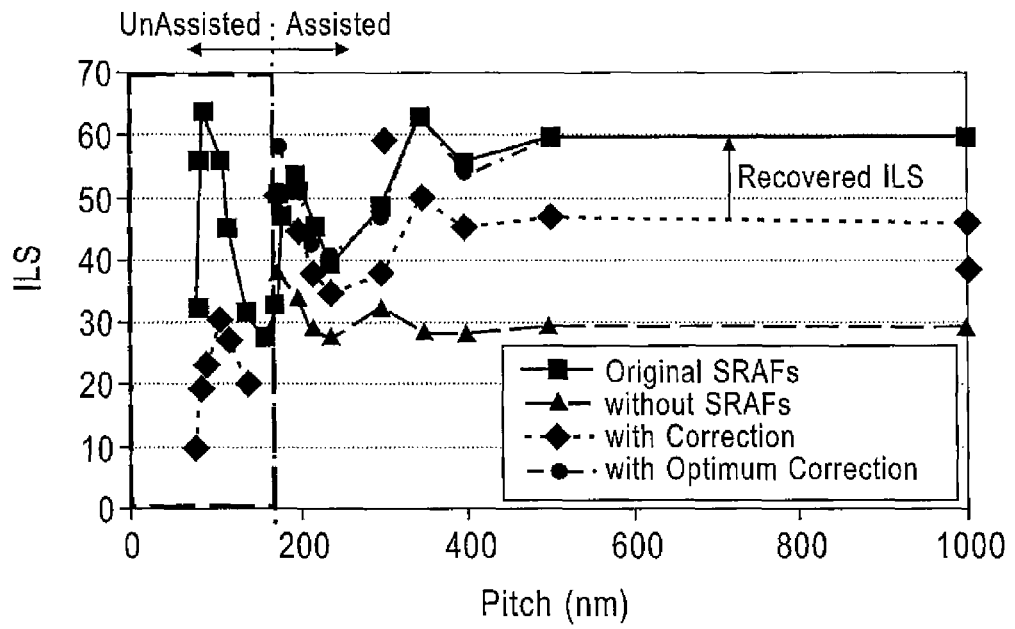
FIG. 8 is a plot demonstrating the benefit of optimizing the parameters of the orthoedged SRAFs in a contrast-related lithographic metric known as Image Log Slope.

FIG. 8 is a plot demonstrating the benefit of optimizing the parameters of the orthoedged SRAFs in a lithographic metric known as contrast, which is measured as Image Log Slope (ILS), for the set of gratings used in FIG. 1. In this regard, particular reference is made to the portion of the plot to the right of the vertical dashed line. Co-optimization of SRAF shape and size and the orthoedge parameters ($N_w$, $N_h$, $P_y$) is needed to maintain good performance in other lithographic metrics such as contrast. So-called original SRAFs lack any orthoedges. The orthoedged SRAFs have a "dashed" character, meaning that the extended line or space IC features on the mask are paralleled by SRAFs that have the appearance of dashed lines or spaces, rather than taking the standard form of narrow sub-resolution lines or spaces paralleling the IC features, as with the so-called original SRAFs. As shown in the plot, contrast loss with naive (not optimized) orthoedge SRAFs is fully recovered after proper SRAF optimization. More specifically, the plot shows the results for the original mask shapes with assist features (solid line), without assist features (dashed line), with orthoedges added to the mask shapes where the orthoedges parameters have been optimized to cancel shift in focus only (dotted line), and a set where the orthoedges parameters applied to the assist features only have been co-optimized to both cancel focus shifts and maintain other quality metrics including contrast comparable to the original mask shapes (dashed-dotted line).

Figure 9:
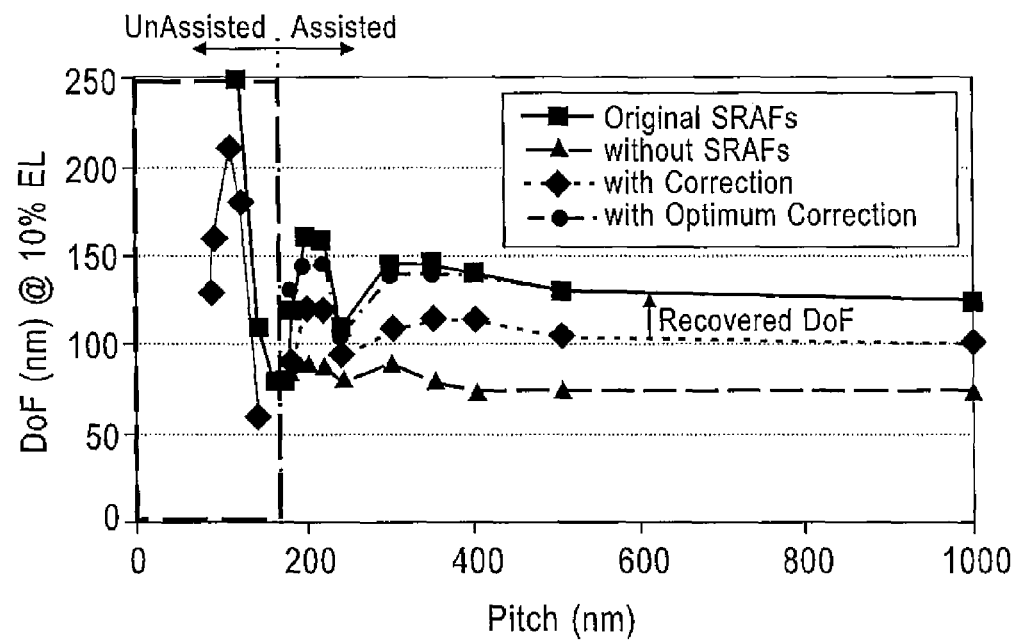
FIG. 9 is a plot similar to that of FIG. 8 for the lithographic metric known as depth of focus (DoF).

FIG. 9 is a similar plot for depth of focus (DoF) for the same set of gratings as in FIG. 8. As with FIG. 8, particular reference is made to the portion of the plot to the right of the vertical dashed line. As shown in the plot, loss of depth of focus with naive (not optimized) orthoedge SRAFs is also fully recovered after proper SRAF optimization. More specifically, the co-optimization of orthoedges parameters, as applied only to the assist features, to both cancel focus shifts and to maintain other quality metrics, is successful in maintaining image depth of focus comparable to the original mask shapes (dashed-dotted line).

Figure 10:
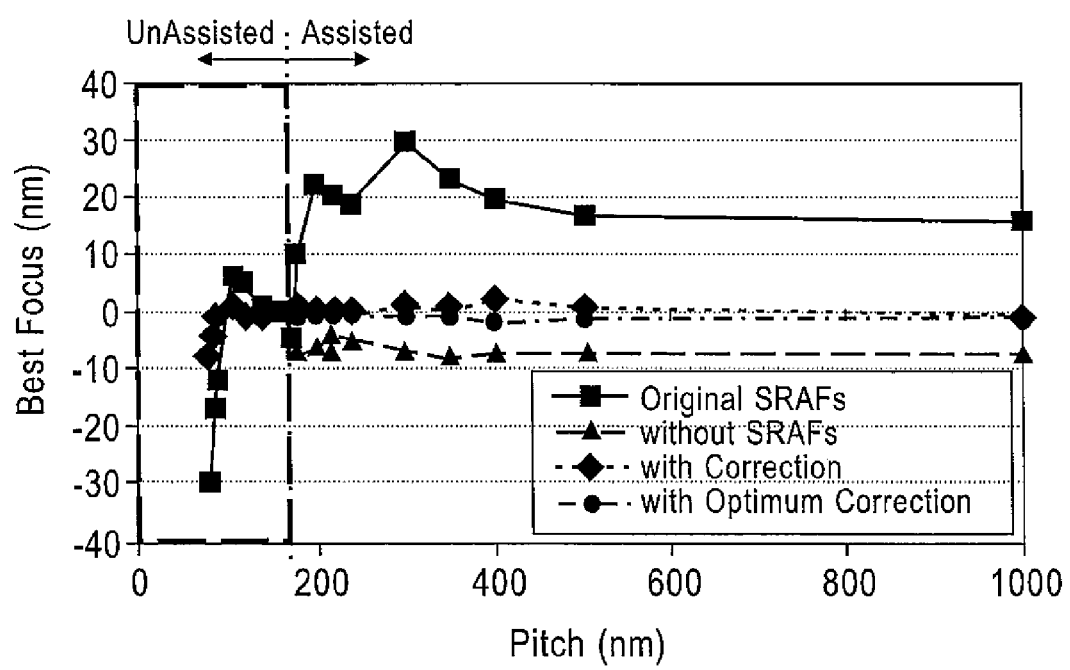
FIG. 10 is a plot of the simulated best focus plane for the same set of gratings as in FIGS. 8 and 9.

At the same time, control over best focus values is maintained, as shown in FIG. 10, which is a plot similar to those of FIGS. 8 and 9. Again, particular reference is made to the portion of the plot to the right of the vertical dashed line. With optimization, the best focus value remains constant across the range of pitches greater than approximately 180 nm, while contrast and depth of focus are greatly improved, as shown in FIGS. 8 and 9, respectively. Here, it is shown that the optimization of orthoedge parameters, as applied only to the assist features, to maintain high values of image quality metrics like ILS, depth of focus, and MEEF, does not compromise the ability of the orthoedges to compensate for shifts in focus (dashed-dotted line vs. dotted line).

Similarly, optimization of orthoedges to equalize best focus, while preserving other image quality metrics, is found to entail only a minor tradeoff in MEEF, which is favorable at some pitches, and mildly favorable overall. More specifically, the optimized orthoedges achieve MEEF values of about 2.5 in the pitch range from 180 nm to 350 nm, whereas MEEF with the conventional SRAFs rises as high as 4.5. On the other hand, the conventional SRAFs achieve MEEF levels of about 2.25 for pitches larger than 350 nm, whereas MEEF with optimized orthoedges rises as high as 3 for these pitches.

Figure 11:
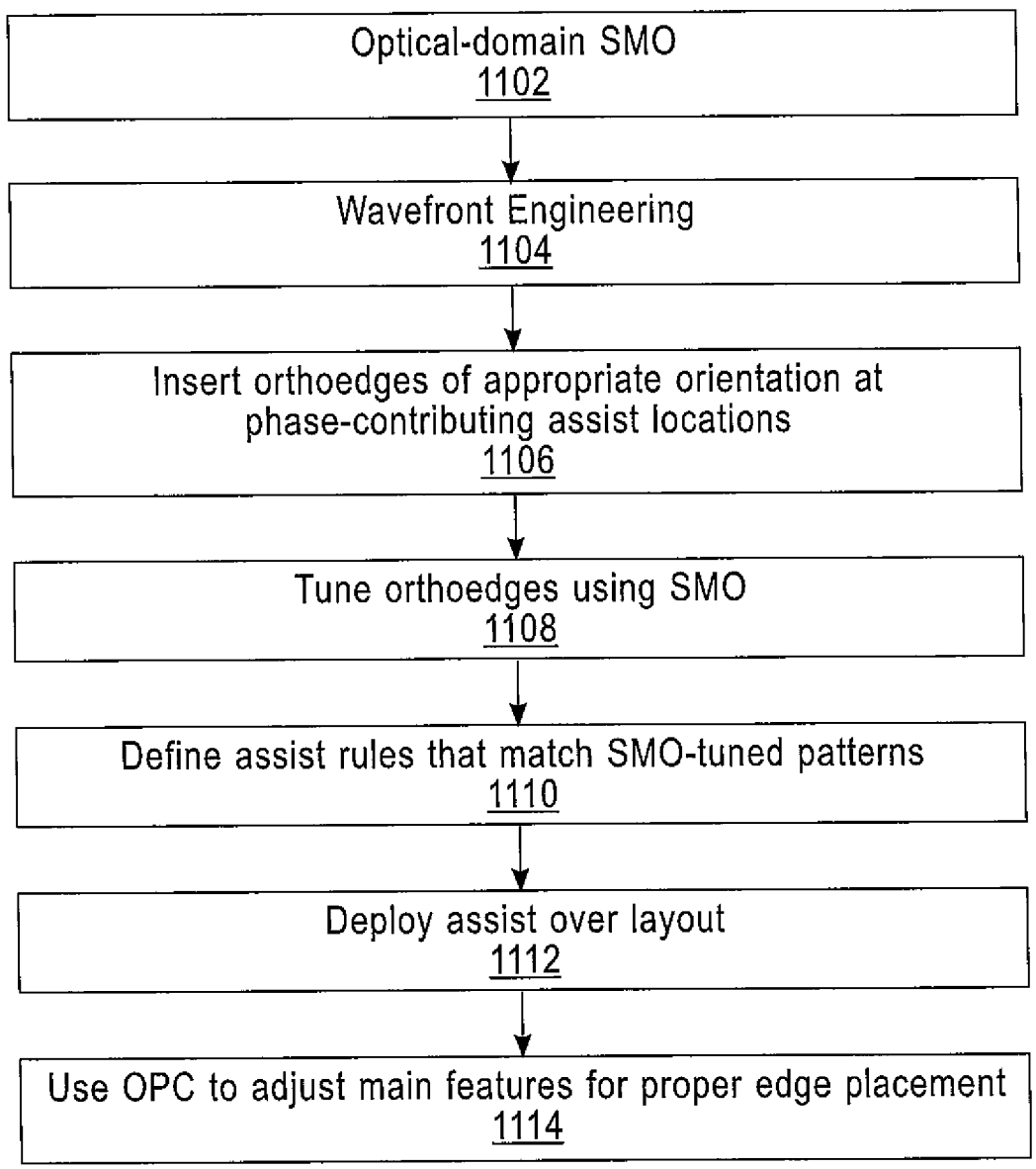
FIG. 11 is a flow chart showing the overall flow of the present invention.

FIG. 11 is a flow chart showing the overall flow of the invention. Starting with block 1102, the first step is to carry out the known procedure of optical-domain SMO to arrive at an intermediate solution that uses optical domain mask variables, with these optical domain variables being expressible, for example, in terms of the band-limited optical amplitude at the exit face of the mask, or in terms of the amplitudes of the diffraction orders collected by the projection lens. Next, the known procedure of wavefront engineering is carried out in block 1104 to arrive at an intermediate solution set of polygon-domain variables, with these variables defining polygonal apertures in an intermediate mask solution. Optical-domain SMO and wavefront engineering will be known to those of ordinary skill in the art as a suitable way for arriving at a polygon-domain intermediate mask solution, but there are other well-known methods that may be used instead, such as to deploy biased target shapes as main features, and to deploy SRAFs using so-called assist rules. Next, in block 1106, orthoedges of appropriate orientation are inserted at phase-contributing assist locations. To ensure that the insertion locations are phase contributing, one can use the known method of checking that the separation between each such location and the location of the nearest main feature edge is approximately equal to the separation between the peak of the dominant imaging kernel (often referred to as the dominant SOCS kernel) and the similarly displaced portion of a secondary peak or lobe within the dominant imaging kernel. These two distances should be approximately equal to within a difference that is small compared to the ratio of the actinic wavelength (λ) and the numerical aperture (NA) of the projection system. The appropriate orientation for the orthoedges that are inserted in block 1106 is the orientation that is perpendicular to the mask aperture edge within the intermediate solution from block 1104 at the insertion point. The lengths of the inserted orthoedges should be small compared to the λ/NA ratio, and the weighted lengths of the orthoedges and the edges that connect them should be roughly equal when the weights in question are made proportional to the imaginary parts of the BL for each orientation. Next, in block 1108, the orthoedges are tuned using source mask optimization (SMO). SMO in block 1108 preferably uses polygon-domain optimization, and may include source variables in the optimization step. Then, in blocks 1110, 1112, and 1114, the known steps of defining assist rules that match SMO-tuned patterns; deploying assists over the mask layout; and using optical proximity correction (OPC) to adjust main features for proper edge placement, respectively, are carried out.

Figure 12A:
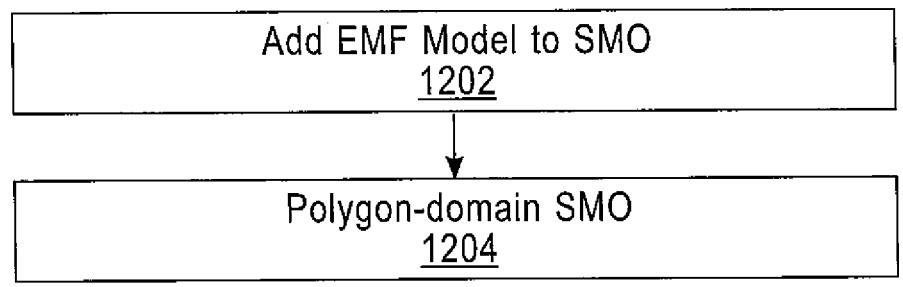
FIG. 12 comprises FIGS. 12A and 12B, which are flow charts showing the orthoedge tuning step in more detail.
Figure 12B:
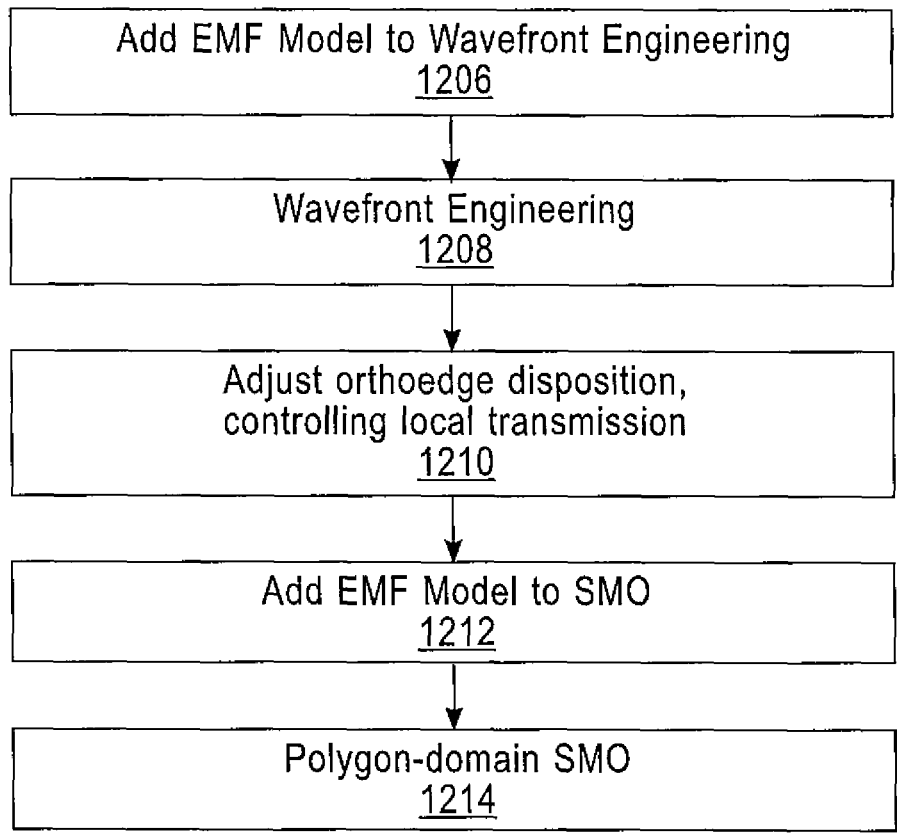

FIG. 12 comprises FIGS. 12A and 12B, which are flow charts showing the orthoedge tuning step in block 1108 in more detail. The orthoedge tuning step incorporates source and mask optimization steps from the prior art. FIG. 12A shows a simple embodiment of the orthoedge tuning in block 1108. First, an EMF model is added to SMO in block 1202. This may be done by adding BL features along the edges of the mask features. Different sets of BLs may be used with different regions of the source, in the known hybrid-Hopkins-Abbe method. Finally, in block 1204, the prior-art step of polygon-domain optimization is carried out. A technical complication can arise here if one seeks an efficient way to calculate optimization gradients when BLs are present. Standard optimization algorithms make use of the derivatives of problem metrics with respect to problem variables, the set of such derivatives being known as the gradient. As the number of variables increases, it is desirable that the computational cost of calculating the gradient scale only in near-linear fashion, rather than, for example, quadratically with the number of variables. Methods are known for achieving near-linear scaling in gradient calculations during optimization of polygons when diffraction from the polygonal aperture areas is modeled using the thin-mask approximation (TMA). However, BLs involve diffraction from the edges of the apertures, which in effect brings higher-order derivatives into the calculation. An appendix at the end of the detailed description section explains how near-linear scaling can be achieved during gradient calculations for EMF-aware SMO.

An alternative to the FIG. 12A flow is shown in FIG. 12B, which takes advantage of the fact that wavefront engineering can be carried out with EMF awareness, as shown in U.S. Pat. No. 8,108,802, the teachings of which are incorporated herein by reference. This makes possible the FIG. 12B embodiment in which step 1210 follows immediately after step 1208 without carrying out step 1106, and in which step 1208 within block 1210 is used to carry out part of the bypassed block 1106 functionality. Specifically, in the FIG. 12B embodiment the wavefront engineering step 1208 is carried out after adding an EMF model in step 1206, for example, a BL model. One may separately carry out a wavefront engineering solution with the EMF model turned off for purposes of comparison, as will be discussed. Next, new block 1210 optionally carries out a step in which particular edge segments are removed from main features when these segments have an orientation perpendicular to the orientation of the local design shape, with the longest such segments being chosen in particular for deletion. Block 1210 causes mask main features to more closely resemble the main features that OPC produces. The specific cutoff for deletion may be chosen by comparison with the average length that is held by segments having this same orthogonal orientation in the solution to a separate comparison wavefront engineering run that is made with the EMF model turned off. It should be noted that such segments will usually be present even in the absence of an EMF model since polygon edges need to be fragmented in order to suitably tune the local feature transmittance during optimization or OPC, and these tunable fragments will necessarily be connected by orthogonally oriented edges, though these connectors will typically be fairly short when the EMF model is turned off. However, in cases where the reference wavefront engineering feature has no orthogonally oriented segments, the cutoff length can be set to zero. Block 1210 also includes a step in which orthogonally oriented segments in assist features are extended in order to approximately maintain an overall balance in quadrature component after the particular orthogonally oriented edges of longest length have been removed from main features, while the edges that connect to the orthoedges in the assists are simultaneously adjusted in order to approximately maintain local transmission. Block 1210 may further include a step of inserting new orthogonally oriented edges into assist features for this purpose. Block 1210 is followed by blocks 1212 and 1214 whose primary function is the same as in the FIG. 12A embodiment.

It should be noted that in either of the FIG. 12 embodiments the so-called "forward" imaging simulations within the SMO step 1204, 1214 can include the introduction of globally scoped lens aberration aimed at EMF-mitigation, allowing these tailored aberrations to act in synergy with the present orthoedges, or as a supplement to the orthoedges. In these embodiments, the directionally varying quadrature component of the introduced blanket aberration serves as a strategically co-designed addition to the corrective amplitude provided by the orthoedges. For example, the introduced lens aberrations may be tailored for best overall correction of focus shift in unassisted pitches, with orthoedges being deployed in assisted pitches. Alternatively, or in addition, the introduced aberration may be tailored to reduce the required orthoedge density in those pitches that would otherwise be most strongly focus-shifted, in order to reduce the number of orthoedges in these features and their assists, thereby reducing the number of patterning shots needed to delineate these orthoedges during mask fabrication, and ultimately reducing the time needed to write the mask. This in turn translates into masks with lower cost and more tightly controlled features. Although introduced aberrations of global scope can only provide a weak and limited pattern selectivity, namely the selectivity that arises from differences in the directional concentration of the partially coherent light which diffracts from different kinds of features into different parts of the pupil, orthoedges can fine-tune this baseline correction in an intricately customized way for each pattern.

It should be noted that the local focus adjustment capability provided by proper orthoedge deployment can also be used to influence the nascent sidewall angle of the developed photoresist film, since the finite thickness of the film will span a range of defocus positions within the converged image beam. Variations in exposure sensitivity through the depth of the resist can also induce a change in the shape of the print contour between the top of the resist and the bottom. Though this sensitivity variation generally takes the form of a uniform vertical sensitivity profile that applies globally across the entire wafer, adjustments in local mask transmission via sub-resolution decorations can provide an adjustable modulation of the impact of this sensitivity profile on a locally tailored basis, as disclosed in U.S. Pat. No. 7,969,554, the teachings of which are incorporated herein by reference, which patent also discloses the use of SMO technology to introduce controlled changes in the local print contour through depth by this means. The basic mechanism involved is that the local decorations can tune the local dose in such a way as to be above the print threshold for some depth locations, but below the print threshold at other depth locations, thereby producing controlled relative changes in the print contour through the depth of the resist. These changes in the print contour through different depth planes essentially constitute a local adjustment of the resist sidewall profile. In addition, so-called "top loss" in the resist can similarly be controlled by ensuring a sufficiently low intensity in dark regions relative to the print threshold at the upper surface of the resist. An improvement to such multiple-image-plane optimizations can be made by including EMF-awareness in the SMO forward simulations while also deploying orthoedges in mask features, thereby allowing changes in the print contour through depth to be adjusted on the basis of phase and refocus, as well as by local transmission adjustment and differential sensitivity. The orthoedges employed may, for example, take the form of "hammerheads" at the terminations of line-like features.

Figure 13:
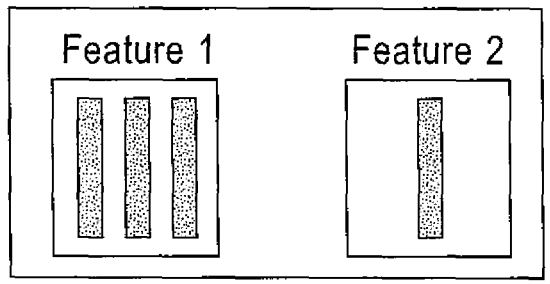
FIG. 13 shows schematic representations of a "Feature 1" and a "Feature 2" on a mask.

In order to contrast the present invention with techniques of the prior art, reference will now be made to several highly schematic figures. For the sake of discussion, the lithographic imaging of two highly simplified features using prior-art techniques and the present invention will be compared. Referring first to FIG. 13, schematic representations of a "Feature 1" and a "Feature 2" are shown. The two mask patterns might, for example, represent either areas of opaque absorber on a mask quartz substrate (lines) or apertures etched in the absorber down to the substrate (spaces). "Feature 1" represents a typical dense line environment, while "Feature 2" represents a typical isolated line environment. The difference between them may, for example, be understood to be in their relative pitch, with fine-pitch "Feature 1" consisting of a feature or features that are positioned more closely to neighboring features than is the case with "Feature 2", whose feature or features are separated by a comparatively large distance from all other features in their neighborhood. As we have seen above, the pitch between various features on a mask can have a great effect on the positions of best focus of the features, and can result in those positions being quite different. In general, "Feature 1" and "Feature 2" can be taken to represent features whose planes of best focus are highly separated when prior art masks are used. The range or zone of adequate focus for "Feature 1" may partly overlap that of "Feature 2", but the two focal ranges will not be centered on the same plane of best or optimal focus. Since focus is determined by the quadratic phase component of the directional distribution of light that converges to each feature, the sharpness of the image will usually only deteriorate in a slow and quadratic way about each feature's plane of optimal focus, giving rise to an extended focal zone or range for each feature within which adequate image sharpness is attained. Since image sharpness varies quadratically within these zones, one may loosely envision each through-focus image as being elongated and ellipsoidal in character about its best-focus plane, and these zones are so-depicted in FIG. 14. However, the zones of adequate focus for "Feature 1" and "Feature 2" will not be fully overlapped, and the light that comprises at least one of these images will become too highly diverged outside the narrow overlapped region to provide an image of adequate sharpness.

FIG. 14 is a highly schematic view of the expected results of the lithographic imaging of a mask 1402 with "Feature 1" and "Feature 2" in the direction of a wafer (not shown) using standard lithographic practice, where the mask does not have assist features of any kind. The vertical direction represents the focal axis, commonly the z-axis. Due to mask topography effects, the center focal planes of denser and isolated patterns also tend to be located at different heights along the z-axis. Specifically, the lens 1404 of a lithographic apparatus focuses the two images, but the plane of best focus for "Feature 1", represented by dashed line 1406, does not coincide with that for "Feature 2", represented by dashed line 1408. Denser patterns ("Feature 1") display a larger depth of focus, represented by the longer extent of the printed pattern along the focal axis (z-axis), while more isolated patterns ("Feature 2") display smaller depth of focus, represented by the shorter extent of the printed pattern along the focal axis. The ranges of acceptable focus positions for the two features, represented by elongated ellipsoidal zones that intersect dashed lines 1406, 1408, are not uniformly large and are offset from one another. In particular, the focal range 1412 for "Feature 2" is smaller than the focal range 1410 for "Feature 1", and barely overlaps with that of "Feature 1". As a result, zones of acceptable common focus for all features might, for example, only have an extent on the order of approximately 10 nm. In practice, wafers cannot be held to the stringent positioning and flatness tolerances that are thereby entailed.

FIG. 15 is a highly schematic view showing a mask 1502 with "Feature 1" and "Feature 2" being projected in the direction of a wafer (not shown) using a mask having assist features of the prior art, such as SRAFs, or so-called "zebra stripes", which are unresolvable halftones superimposed on some mask features to extend focal ranges, added to the mask shapes of isolated patterns. Assist features or other gray-scale mask features are used to increase the depth of focus of isolated features, represented in this figure by the longer extent of the printed isolated pattern along the focal axis, however these conventional assist features do not help to align the center focus of dense and isolated patterns. The lens 1504 of a lithographic apparatus focuses the two images, but the plane of best focus for "Feature 1", represented by dashed line 1506, again does not coincide with that for "Feature 2", represented by dashed line 1508. The ranges of acceptable focus positions 1510, 1512, represented by elongated ellipsoidal zones that intersect dashed lines 1506, 1508, for the two features, are closer in extent, but are still offset from one another. Nevertheless, the focal range 1512 for "Feature 2" overlaps with the focal range 1510 for "Feature 1" to a greater extent than shown in FIG. 14 since the prior art assisting SRAFs or zebra stripes have extended the focal range 1512 of "Feature 2", but these techniques do not ensure that the focal ranges of different features will be aligned.

FIG. 16 is a highly schematic view showing a mask 1602 with "Feature 1" and "Feature 2" being projected in the direction of a wafer (not shown) using a mask having the orthoedge features of the present invention. The lens 1604 of a lithographic apparatus focuses the two images. The plane of best focus for "Feature 1", represented by dashed line 1606 coincides with that for "Feature 2", represented by dashed line 1608. The ranges of acceptable focus positions 1610, 1612, represented by elongated ellipsoidal zones that intersect dashed lines 1606, 1608, for the two features are no longer significantly offset from one another, and are of close extent. The orthogonally oriented edge segments inserted into mask apertures in accordance with the present invention can provide a means to align the center focus of all patterns in the layout while maintaining an increased depth of focus for isolated features.

FIG. 17 illustrates in a highly schematic way the focal ranges for "Feature 1" and "Feature 2" using standard lithographic practice, where the mask does not have assist features of any kind, as in FIG. 14. The upper portion of FIG. 17 will be recognized to be the same as the lower portion of FIG. 14. The bottom portion of FIG. 17 includes the so-called "Bossung" plots of critical dimension (CD) against focus for "Feature 1" and "Feature 2". A Bossung curve of a pattern in optical lithography is a plot of linewidth measurements (Critical Dimension or CD) vs. focus for varying values of exposure dose, with the best focus being determined by the extremum point for each pattern. Wider and flatter curves of linewidth vs. focus for denser patterns ("Feature 1") are a characteristic of larger depth of focus as compared to the narrower and rapidly falling curves indicating smaller depth of focus for the more isolated patterns ("Feature 2"). The shift in best focus results in Bossung curves that are centered far apart from each other along the focus axis. Nested curves for different doses (exposure levels produced by the incident waves) are included to show that they peak at the same focus setting. In this example, the target CD for "Feature 2" may be considered to be larger than the target CD for "Feature 1", as reflected by the higher position of the "Bossung" curves for "Feature 2" along the vertical axis. It was noted above that the plane of best focus for "Feature 1", represented by dashed line 1406 in FIG. 14, does not coincide with that for "Feature 2", represented by dashed line 1408 in FIG. 14. This may be seen in FIG. 17 as the "Bossung" plots for "Feature 1" and "Feature 2" have peaks which are at different focus values. That the focal range for "Feature 2" is smaller than that for "Feature 1" is illustrated by the relative narrowness of the plots for "Feature 2".

Similarly, FIG. 18 illustrates in a highly schematic way the focal ranges for "Feature 1" and "Feature 2" when either conventional assist features or other gray scale mask features (such as zebra-stripe type of patterns) are added to the mask shapes of isolated patterns, as in FIG. 15. The upper portion of FIG. 18 will be recognized to be the same as the lower portion of FIG. 15. It was noted above that the plane of best focus for "Feature 1", represented by dashed line 1506 in FIG. 15, does not coincide with that for "Feature 2", represented by dashed line 1508. This may be seen in FIG. 18 as the "Bossung" plots for "Feature 1" and "Feature 2" have peaks which are at different focus values. That the focal range for "Feature 2" is like that for "Feature 1" is illustrated by the comparable width of the plots for the two features. The increase of depth of focus for the isolated patterns after conventional assist features or other gray-scale mask features are added to the mask results in wider and flatter Bossung curves, while the best or center focus remains unaffected.

A final figure in this set, FIG. 19 illustrates in a highly schematic way the focal ranges for "Feature 1" and "Feature 2" using a mask having the orthoedge features of the present invention, as in FIG. 16. The upper portion of FIG. 19 will be recognized to be the same as the lower portion of FIG. 16. It was noted above that the plane of best focus for "Feature 1", represented by dashed line 1606 in FIG. 16, coincides with that for "Feature 2", represented by dashed line 1608. This may be seen in FIG. 19 as the "Bossung" plots for "Feature 1" and "Feature 2" have peaks which are at the same focus values. That the focal range for "Feature 2" is like that for "Feature 1" is illustrated by the comparable width of the plots for the two features. The orthogonally oriented edge segments inserted into mask apertures in accordance with the present invention align the focal ranges of different features. The invention provides both an increase the depth of focus of isolated features as well as the alignment of the center focus of all patterns in the layout.

FIG. 20 illustrates a simple two-dimensional pattern 2002 formed by densely and regularly spaced contact shapes 2004 in a staggered arrangement, along with the numerically simulated "Bossung" plot 2006 that the image of this pattern forms on the wafer plane. The center focus 2008 for this 2-dimensional dense contact pattern appears located around the 0 nm focus plane.

FIG. 21 illustrates an example of a 2-dimensional isolated contact mask pattern 2102 comprising a main contact feature 2104 and a set of conventional assist features 2106, and the simulated "Bossung" plots 2108 the image of this mask pattern generates on the wafer plane. The difference 2110 in center focus between this isolated contact pattern with conventional SRAFs and the center focus of the dense 2-dimensional contact pattern of FIG. 20 is measured to be about 60 nm. If the conventional assists had not been applied to the isolated contact, this focus shift would have been reduced to about 7 nm, but the individual DOF for this feature would have decreased by about 20% in the absence of assists.

Finally, FIG. 22 illustrates the same example of FIG. 21 of an isolated contact mask pattern 2202 comprising a main contact feature 2204 and a set of SRAFs 2206 where orthoedges 2208 have been applied and optimized for good lithographic performance. In this 2-dimensional example of the application of the orthoedges, the simulated "Bossung" plots 2210 show a center focus for the image generated by this pattern around 0 nm, and a focus difference 2212 with respect to the center focus of the dense 2-dimensional contact pattern of FIG. 20 of nearly 0 nm, and in addition provide the isolated contact with a slightly larger individual DOF than the conventionally assisted isolated contact of FIG. 21. The invention is thus seen to provide both focus equalization and large individual DOF.

Figure 23:
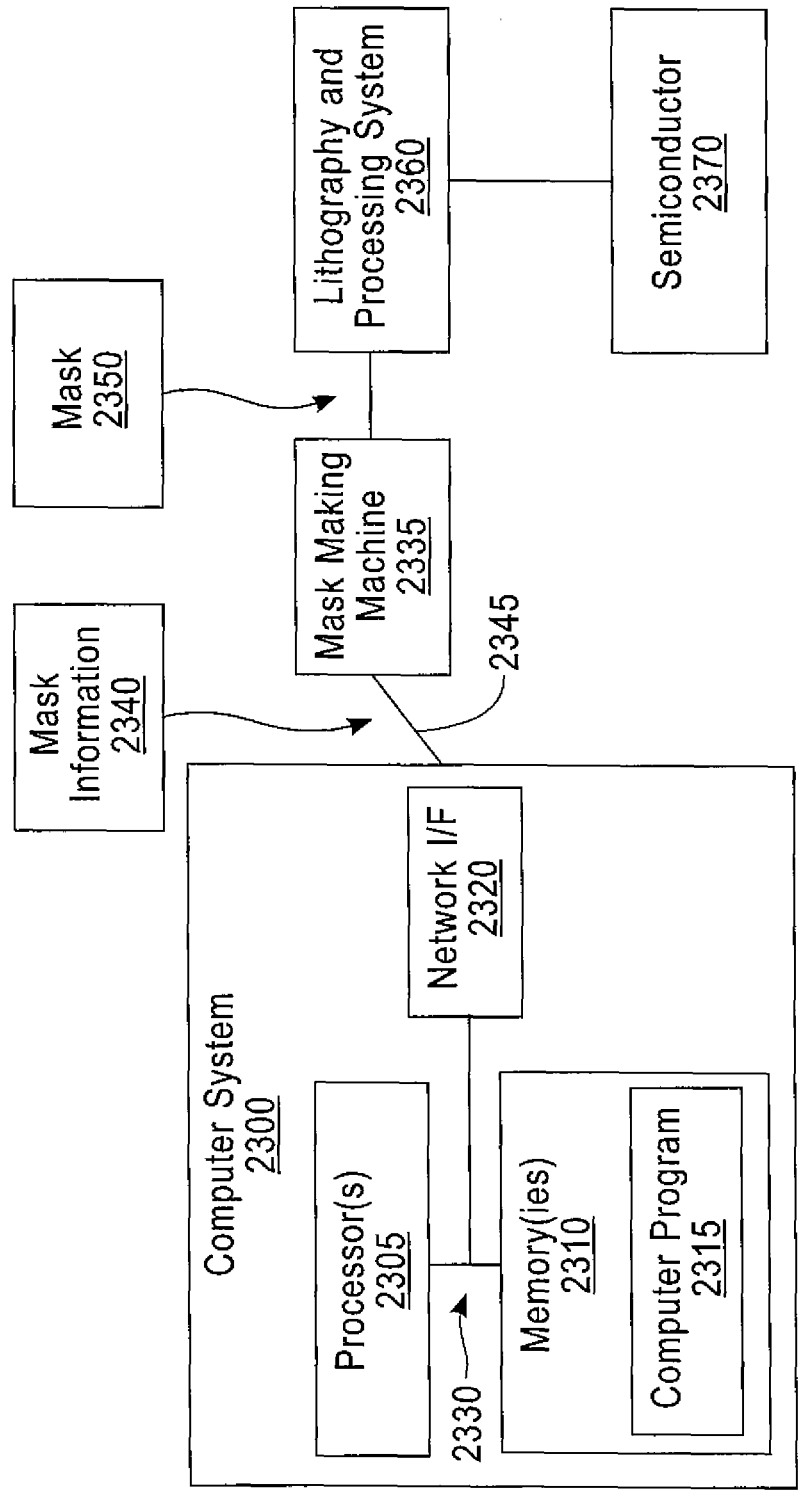
FIG. 23 shows an exemplary system for practicing the present invention.

FIG. 23 shows an exemplary system for practicing the present invention. The system includes a computer system 2300 having one or more processors 2305, one or more memories 2310, and one or more network interfaces 2320, interconnected using one or more buses 2330. The one or more memories 2310 include a computer program 2315 defined to cause the computer system to perform one or more of the operations described herein. In one embodiment, mask information 2340 is output to the mask making machine 2335 via link 2345. The mask making machine 2335 makes a mask 2350 from the mask information 2340. The mask 2350 is used by the lithography and processing system 2360 to create device shapes on the semiconductor 2370.

The present invention may be a system, a method and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded therein, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other devices to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending on the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of any and all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Various modifications and adaptations may become apparent to those skilled in the relevant arts in view of the foregoing description, when read in conjunction with the accompanying drawings. However, any and all modifications of the teachings of this disclosure will still fall within the scope of the non-limiting embodiments of this invention.

Although described in the context of particular embodiments, it will be apparent to those skilled in the art that a number of modifications and various changes to these teachings may occur. Thus, while the invention has been particularly shown and described with respect to one or more embodiments thereof, it will be understood by those skilled in the art that certain modifications or changes may be made therein without departing from the scope of the invention as set forth above, or from the scope of the claims to follow.

Various modifications and adaptations may become apparent to those skilled in the relevant arts in view of the foregoing description, when read in conjunction with the accompanying drawings. However, any and all modifications of the teachings of this disclosure will still fall within the scope of the non-limiting embodiments of this invention.

Although described in the context of particular embodiments, it will be apparent to those skilled in the art that a number of modifications and various changes to these teachings may occur. Thus, while the invention has been particularly shown and described with respect to one or more embodiments thereof, it will be understood by those skilled in the art that certain modifications or changes may be made therein without departing from the scope of the invention as set forth above, or from the scope of the claims to follow.

APPENDIX

It is common practice in the art to use optimized TMA masks as templates from which to extract assist feature layout rules (where, as discussed, TMA refers to an idealized scalar mask whose finite-thickness topography is neglected). In particular, it is known that useful assist layout rules can be extracted from mask clips a few microns in size whose mask feature content (including assists) has been designed using mathematical optimization. In order to follow this practice with masks of the present invention, it is desirable to carry out EMF-aware optimization of mask clips that contain orthoedges, with these clips being of the usual multi-micron size. Here EMF-aware refers to the inclusion of finite-thickness topography effects in the mask imaging model, for example by including boundary layers (BLs) to represent the edge fields produced by the finite-thickness mask topography. Multi-micron clips are fairly large in the context of lithographic optimization, so to be of practical value the optimization algorithm should exhibit a near-linear scaling with mask area. Methods are known for achieving such scaling in the case of scalar thin-masks and in particular optical-domain masks, such methods being described, for example, in Y. Granik, "Fast pixel-based mask optimization for inverse lithography," JM3 5, no. 4 (2006): p. 043002. However, the presence of mask BLs and the need for optimization of orthoedge deployment renders these known methods inapplicable. This appendix explains how EMF-aware optimization of masks that have orthoedges can be carried out with near-linear scaling.

The intensity $I(\vec{x})$ produced at an image point by a particular source (or portion of a source) can be calculated from the mask patterns as $$I(\vec{x}) = \sum_{\sigma=1}^{L} \left| \varphi_\sigma * m(\vec{x}) + \varphi_\sigma * \frac{dm}{db} a(\vec{x}) \right|^2 \qquad [A.1]$$

Here $\vec{x}$ is a 2-element vector denoting the x and y coordinates of an image point. The $\phi^\sigma$ are the so-called SOCS or optical kernels, which can be calculated using well-known methods (e.g. A. E. Rosenbluth et al., "Fast calculation of images for high numerical aperture lithography," SPIE v.5377 Optical Microlithography XVII (2004): p. 615.)

Eq. [A.1] is only strictly accurate as an infinite series, but in practice the total number of optical kernels L might be limited to a relatively small number, for example, in the range of 10 to 50. For use with BLs the set of L kernels should preferably contain separate kernels for differently polarized parts of the source. $m(\vec{x})$ denotes the mask transmission, which in a simple binary mask might be 1 at points $\vec{x}$ that are inside mask polygons, and 0 outside. The "*" symbol denotes continuous-domain convolution.

The $\phi_o * m$ term is a well-known factor in optimization calculations with prior-art TMA masks, while the $(\phi_o*(dm/db) a(\vec{x})$ term represents the amplitude contributed by the mask BLs. The factor dm/db refers to the derivative of the mask apertures with respect to an incremental change in mask bias. Expressed as a function of position, dm/db traces the rim of the mask apertures, and can be taken for simplicity to have delta-function width in the direction normal to the aperture edge. a(x,y) represents the width-transmission product of the BL. a(x,y) would usually be a bi-valued function that switches appropriately between the different complex BL transmissions of x-oriented and y-oriented mask edges, based on the local edge orientation at each point x,y along aperture rims. For clarity the case of so-called Manhattan mask polygons will be described here, i.e. polygons will be considered rectilinear with edges that are either horizontal or vertical.

It should be noted that the value of a(x,y) may be different for differently polarized parts of the source, and that these different source regions may be handled by different kernels in the $\phi_o$ set. In that case a(x,y) will depend on $\sigma$, and can be written $a_\sigma(x,y)$. For simplicity this option has not been explicitly indicated in eq. [A.1], because there is otherwise little impact on the equations to follow.

SMO problems are typically formulated in terms of constraints and objective that for the most part involve the intensity at various sample points, with the location of these sample points being determined by the shape of the target patterns. FIG. 24 shows in schematic form how different intensity sample points can be laid out in an illustrative example where the performance metric to be maximized during optimization is the so-called integrated process window. A simple rectangular pattern has been chosen for a target shape in this example, and it is the target shapes that determine the sample point locations used by SMO. Quantitative methods for choosing specific locations for the sample points are described in K. Tian et al., "Method for optimizing source and mask to control line width roughness and image log slope", U.S. Pat. No. 8,372,565, the teachings of which are incorporated herein by reference. The terms "formulation" and "problem statement" customarily refer to the mathematical description of the optimization problem that defines an optimal lithographic outcome, with these formulations typically comprising an objective function to be optimized, and constraint equations that the optimized solution must satisfy.

The SMO formulation may choose as the objective to be optimized a lithographic performance metric of the kind that involves gating (first-to-fail) or worst-case features, such as the so-called integrated-process-window or PV band metrics. In such cases, it is useful to mathematically define the objective using a simple expression based on auxiliary variables, with these auxiliary variables being automatically forced into equivalence with the chosen gating performance metric by the optimization process itself, as well as by the constraints of the optimization formulation, where these constraints encapsulate the explicit connection between the performance metric and the image content. More specifically, maximization of the performance metric (as objective) pushes the auxiliary variables to the overall binding limits defined by a large number of inequality constraints, with the image quality in each small sampled region of the image being represented by a constraint, and where the binding limit is determined by whichever constraints turn out to be most limiting of performance. As the optimization proceeds, the image quality and associated binding limits improve, and the optimizer can automatically increase the performance objective.

For example, if integrated process window is chosen as the objective to be maximized (the objective being generally denoted $C_0$ in the following equations), the process window objective can be defined in terms of auxiliary variables $w'_z$ and $w''_z$ via the simple equation $$C_0 = \sum_z (w'_z - w''_z), \text{ with } C_0 \text{ to be maximized} \quad [A.2]$$

In eq. [A.2] the z sum ranges over a set of defocused sample planes, and in each focal plane z, auxiliary variables are used to reciprocally (i.e. inversely) track the minimum and maximum allowable exposure doses, these being the auxiliary variables $w'_z$ and $w''_z$, respectively.

More specifically, the precise definitions of $w'_z$ and $w''_z$ make use of the fact that (considering first the $w'_z$ variables) the minimum allowable dose is inversely proportional to the darkest intensity that occurs on the wafer amongst all print positions where imaged bright features would be underexposed to the worst allowable decrease in width (where the width referred to is that of the developed openings in the resist, for the case where the resist is positive-tone). This follows from the standard simplifying assumption that the product of the overall dose level and the relative intensity at any point along the print contour will be equal to the threshold energy for resist dissolution. Under this assumption, the point of darkest intensity amongst all locations of minimum allowed width would be the first location at which an underexposed printed image would hit the tolerance limit as dose (and associated printed width) was steadily decreased. Thus, $w'_z$ is defined as the minimum intensity (in the zth focal plane) that occurs at any of the points within the wafer image that constitute locations of largest allowable underexposure of a bright feature. FIG. 24 shows that such locations are displaced away from nominal target edges into regions of brighter (above-threshold) intensity. The chosen offset displacement may correspond to a tolerance on allowable shift in printed edge position. For given resist sensitivity and nominal dose criteria, the $w'_z$ minimum intensity will be inverse-monotonically equivalent to the largest allowable downward dose fluctuation that leaves all patterns within dimensional tolerance when printing a particular image. Likewise, $w''_z$ is defined as the maximum intensity (in the zth plane) that occurs at any of the points within the wafer image that constitute locations of largest allowable overexposure of a bright feature.

$w'_z$ and $w''_z$ are forced into conformance with these performance metric values by constraints that are imposed at each of a number of sample points which are placed at multiple locations adjacent to the desired print locations of the target feature edges. For example, referring to FIG. 24, the required dimensional tolerances on the printed features may be used to define a set of sample points, designated CD−, that are offset from the nominal target edge positions in the direction of increasing image intensity by a distance corresponding to the maximum allowed underexpose bias that can be tolerated in the printed position of each target edge. For each sampled focal plane, for example the zth, and for each such underexpose position, a constraint is added to the SMO problem formulation which requires that process window variable $w'_z$ be consistent with its role in defining the minimum allowable underexpose dose if the particular CD− location turns out to be gating. If the constraint in question is the ith constraint in the formulation, it can be written as $$c_i(\vec{e}) \geq 0,$$

where $$c_i(\vec{e}) = I_{z(i)}[CD_{-,i}] - w'_{z(i)}$$

where $I_{z(i)}[CD_{-,i}]$ denotes the intensity at the particular CD− location when the projection lens is focused at the particular focal plane. Similarly, if constraint number i+1 is used to define the overexpose limit at the same edge position and focus, it can be written $$c_{i+1}(\vec{e}) \geq 0,$$

with $$c_{i+1}(\vec{e}) = w''_{z(i+1)} - I_{z(i+1)}[CD_{+,(i+1)}] \quad [A.4]$$

The first lines of eqs. [A.3] and [A.4], i.e. $c(\vec{e}) \geq 0$, represent a useful general form for all inequality constraints in the formulation (and such inequality constraints can also be deployed in paired form to specify equality constraints). Here $\vec{e}$ denotes the problem variables, which may include, for example, auxiliary variables like the w' and w", as well as variables that represent the position of each adjustable edge in the mask polygons. (The vector notation merely indicates that $\vec{e}$ is a list.)

Eq. [A.3] specifies that the w' variable for the zth focal plane can be no larger than the intensity at a particular point on an offset target contour that is biased to the worst allowable level of underexposure. By applying constraints of this form all along the underexpose tolerance contour, we ensure that the process of maximizing $C_0$ will increase the w' variable for each focal plane until it is forced to conform to its intended value as the minimum intensity occurring at any of the sampled points along the underexposed tolerance contour. This is essentially equivalent to the maximum allowable downward dose fluctuation that can be tolerated when a given image (such as the image produced by a working SMO solution) is used to print wafers. In a similar way, the w" variables can be made to conform to their intended value as the maximum allowable upward fluctuation in dose that can be tolerated in each focal plane. $C_0$ then becomes the integrated process window (i.e. integrated through focus), which is a well-known lithographic performance metric. Note that for convenience the $C_0$ sum has been written with linear terms, i.e. terms of the form $(w'_z - w''_z)$, rather than with terms that directly involve the reciprocal of intensity (i.e. dose). However, if one prefers, it is straightforward to use reciprocal (dose-like) terms to define $C_0$, e.g. $C_0$ can sum terms of the form $((1/w''_z) - (1/w'_z))$. These two variants are quite close numerically (except for a scale factor), because in practice the exposure latitude will almost invariably be small compared to 1 when expressed as a percentage.

Equations [A.2]-[A.4] describe a particular choice of objective (with associated auxiliary constraints), but they reflect a key consideration that is quite general, namely that overall lithographic performance requirements can usually be expressed in terms of multiple constraints whose number will scale linearly with the total mask area being optimized, with each constraint involving a linear combination of intensities at a small fixed number of points. Often these points are specific to the constraint in question, and many constraints only involve the intensity at a single point, as in eqs. [A.3] and [A.4]. Note that these intensities are themselves nonlinear functions of the edge position variables. In some cases the constraint may have a plurality of linear terms that all involve the intensity at the same point, for example, there may be a term proportional to the intensity at a point, and another term proportional to the intensity slope at the same point. It can also be important to impose constraints on required intensity levels in interior bright and dark regions of the patterns to avoid the printing of undesired artifacts (for example, to avoid the problem known as "assist print-through"). Those of ordinary skill in the art will appreciate that many standard lithographic requirements and objectives can be formulated in this way. It will be shown that with formulations of this kind it becomes possible to achieve a linear scaling of total compute time. Note that even though such constraints take on a simple and straightforward form when expressed in terms of intensities, the intensity terms involved now include a complicating non-TMA factor, namely the $\phi_o^*(dm/db)a[\vec{x}]$ term in eq. [A.1] that provides EMF-awareness.

Achievement of near-linear scaling does not require that every constraint take the form of a linear combination of a small number of intensities, and many of the most useful constraint forms outside this category can be included without impacting the scaling considerations described in this appendix. For example, constraints to ensure that the separations between mask edges are kept within the range of manufacturable dimensions can be included at a near-linear cost in compute time by using the method described in U.S. Publication No. US 2013/0019211 A1, the teachings of which are incorporated herein by reference. It should be noted, however, there is one important constraint category whose inclusion has imposed an increased intricacy on the solution below, even though near-linear scaling can ultimately be retained, namely constraints governing the sensitivity to local mask bias error, e.g. constraints that involve the so-called Mask Error Enhancement Factor (MEEF). The MEEF value obtaining at a particular point along the print contour is defined as $$MEEF \equiv \left|\frac{dx}{db}\right| \quad [A.5]$$

Here dx is the differential change in local print contour position (i.e. the local change in print bias at the image plane) per unit of differential bias db in the size of all local features within the mask region centered at the geometrical conjugate of the local print contour position. (By convention all physical mask biases are rescaled by a factor of 0.25 in the typical case where 4× enlarged masks are used.) db may be treated for present purposes as a uniform differential expansion of all mask openings in the clip being optimized. In practice, imperfections in the mask-making process often give rise to small dimensional expansions of the openings etched into the mask film, and this expansion may be approximated as locally uniform in any given region of the mask. If a purely geometrical printing process could be achieved, the MEEF value would be 1, but with state-of-the-art IC patterns the resolution of the imaging process is stretched near its limits, and the MEEF of gating features is almost inevitably somewhat larger than 1. It is often desirable to require that MEEF not exceed a designated tolerance level, denoted $MEEF_{Tol}$; for example, $MEEF_{Tol}$ might be set to 4. If the ith constraint in the formulation is to be a constraint on the MEEF at a particular location, one might choose to write the constraint in a cross-multiplied form that achieves at least a quasi-linear dependence on intensity, namely:

$$c_i(\vec{e}) \geq 0, \text{ with } c_i = MEEF_{Tol}\left|\frac{dI}{dx}\right| - \left|\frac{dI}{db}\right| \quad [A.6]$$

Here dI/dx is the local image slope in the direction perpendicular to the edge (here written as x for simplicity, i.e. the printed edge is assumed here to be vertical at the location in question), and dI/db is the differential change in intensity produced at the particular edge location when the mask apertures in the clip undergo a uniform differential expansion. Eq. [A.6] is essentially based on a cross-multiplied version of the definition in eq. [A.5]. Unfortunately, eq. [A.6] is not strictly linear in intensity because it includes absolute value functions. However, it is easy to automatically calculate the intensity slope term as positive by aligning the distance coordinate in the direction from CD+ to CD−. Such an oriented coordinate will now be denoted $x_\rightarrow$ for simplicity. The |dI/db| term can likewise be linearized, either similarly by assumption (namely that wider openings imply a positive intensity change), or by using two constraints to express the MEEF requirement at the particular edge location, namely:

$$c_i(\vec{e}) \geq 0, \text{ with } c_i = MEEF_{Tol}\frac{dI}{dx_\rightarrow} - \frac{dI}{db} \text{ and} \quad [A.7]$$

$$c_{i+1}(\vec{e}) \geq 0, \text{ with } c_{i+1} = MEEF_{Tol}\frac{dI}{dx_\rightarrow} + \frac{dI}{db}$$

The eq. [A.7] constraints are entirely linear in the image intensity, and, per our requirements, each constraint involves only a limited number of occurrences of the intensity as different linear terms in c. (In this case intensity appears in two such terms.) Note, however, that because the eq. [A.1] expression for intensity already contains a term involving d/db (namely the BL term), the eq. [A.7] MEEF constraints essentially include second derivatives w.r.t. mask bias, once the underlying nonlinear dependence on the mask variables is considered. This imposes a greater intricacy on the optimization solution, as will be discussed. To establish useful notation, we consider here the calculation of a basic second derivative that arises in evaluating MEEF constraints, namely the derivative w.r.t. bias of the BL, which can be written $$\frac{d}{db}\left[\frac{dm}{db}a(\vec{x})\right] = \frac{d}{db}\left[\sum_q \tilde{\delta}(\vec{x}-\vec{x}_q)a_q\right] \quad [\text{A.8}]$$

Here the sum over q is taken over all edges in all mask polygons being optimized. The notation $\tilde{\delta}$ is used to represent a delta-function that traces a single edge of the mask. For example, if the qth edge is vertical, located at $x=e_q$, and if this edge extends from $y=y_{q,q-1}$ to $y=y_{q,q+1}$, then $\tilde{\delta}(\vec{x}-\vec{x}_q)$ will be defined mathematically as $$\tilde{\delta}(\vec{x}-\vec{x}_q) \equiv \delta(x-e_q)rect\left[\frac{y-\bar{y}_q}{l_q}\right], \text{ where} \quad [\text{A.9}]$$

$$\bar{y}_q \equiv \frac{y_{q,q+1}+y_{q,q-1}}{2} \text{ and } l_q \equiv y_{q,q+1}-y_{q,q-1},$$

with a similar definition holding for the horizontal edges. On the right-side of eq. [A.8] the factor $a(\vec{x})$ has been treated as constant along each edge, e.g. varying only with the edge orientation. This reflects the simplest way of handling polygon corners in BL models, namely setting $a(\vec{x})$ to 0 at corner locations, and for the sake of clarity this approach is adopted here. Recall too that $a_q$ may be considered to have a $\sigma$-dependence, though this is not explicitly shown.

A uniform bias at all edges affects both the $e_q$ and $l_q$ terms in eq. [A.9], since bias will expand edges q−1 and q+1 outward along with edge q. To reflect the fact that such a bias will therefore cause an edge to extend in length at convex corner terminations, but to shorten at concave corners, we next introduce a function $\xi(\vec{x})$ that is defined at polygon corners to be +1 in the former case, and −1 in the latter. Similarly, we introduce an indicator function $\eta_q$ that is defined to be +1 at edges where a positive bias increases the location coordinate of the edge (i.e. where positive bias moves the edge in a positive direction along the Cartesian coordinate that is perpendicular to the edge's extent), and −1 when bias shifts the edge in a negative direction. $\eta$ would thus be +1 on upper and rightward edges of bright (transmitting) Manhattan polygons in an opaque mask background, and −1 on lower and leftward edges. Taking into account the bias-induced increase or decrease in BL segment lengths, we then have $$\frac{d}{db}\left[\frac{dm}{db}a(\vec{x})\right] = \frac{d}{db}\left[\sum_q \tilde{\delta}(\vec{x}-\vec{x}_q)a_q\right] \quad [\text{A.10}]$$

$$= \sum_q a_q \frac{d\tilde{\delta}(\vec{x}-\vec{x}_q)}{db}$$

$$= \sum_q a_q \left[\eta_q \dot{\tilde{\delta}}(\vec{x}-\vec{x}_q) + \right.$$

$$\xi(\vec{x}_{q,q-1})\delta(\vec{x}-\vec{x}_{q,q-1}) +$$

$$\left. \xi(\vec{x}_{q,q+1})\delta(\vec{x}-\vec{x}_{q,q+1})\right]$$

Here the $\dot{\tilde{\delta}}$ notation is shorthand for what may be regarded as the derivative of an edge, which is an extended version of the derivative of a delta-function. For example, for a vertical edge at $x=e_q$ that extends from $y=y_{q,q-1}$ to $y=y_{q,q+1}$, $\dot{\tilde{\delta}}(\vec{x}-\vec{x}_q)$ is defined using the notation of eq. [A.9] as $$\dot{\tilde{\delta}}(\vec{x}-\vec{x}_q) \equiv \frac{d\delta(x-e_q)}{dx}rect\left[\frac{y-\bar{y}_q}{l_q}\right], \quad [\text{A.11}]$$

with the equivalent expression applying to horizontal edges.

Eq. [A.8] also shows that with a BL model where a=0 at corners, we have $$BL = \frac{dm}{db}a(\vec{x}) = \sum_q \tilde{\delta}(\vec{x}-\vec{x}_q)a_q \quad [\text{A.12}]$$

In deriving the eq. [A.10] second derivative it was necessary to consider the impact of retraction or expansion into corners as entailed by uniform bias, but this is not necessary when calculating first derivatives w.r.t. bias, the reason being that with first derivatives the corner contributions will have zero measure relative to the edge integrals when the subsequent convolutions are carried out. Thus, we have $$\frac{dm}{db} = \sum_q \tilde{\delta}(\vec{x}-\vec{x}_q) \quad [\text{A.13}]$$

Expressions like eq. [A.10], [A.12], and [A.13] serve as building blocks in calculating the objective values and gradients needed during optimization, as will be discussed.

Many methods for nonlinear optimization include inner loops in which a combined quantity is maximized w.r.t. the problem variables, with this combined quantity being formed as an amalgamation of the problem objective with barrier or penalty terms that initially serve as approximate surrogates for the problem constraints, with these barrier or penalty terms then being evolved during optimization to ultimately enforce the constraint requirements in an exact way. During the inner loops the combined quantity is maximized without explicit constraint (sometimes excepting variable bounds that may be explicitly imposed). This maximization is carried out on the basis of calculated gradients, with second-order information often being built-up and exploited during the course of maximization by means of e.g. the so-called BFGS method. Then, during outer loops, the penalty or barrier terms are adjusted on the basis of the preceding maximization results in such a way as to ensure that succeeding unconstrained maximization solutions conform more and more closely to the solution of the true constrained optimization problem. Convergence may be achieved, for example, if the combined quantity evolves to equivalence with a maximized Lagrangian of the standard kind, i.e. if the penalties vanish for constraints that are not binding, but act as constraint terms in an ordinary Lagrangian for those constraints which are binding on the solution.

For example, when the so-called Augmented Lagrangian method is used to solve a constrained optimization problem, the combined quantity to be maximized is formed by adding quadratic terms to the usual linear constraint terms of an ordinary Lagrangian, in order to improve convergence. More specifically, the Augmented Lagrangian (AL) is defined as $$AL \equiv C_0(\vec{e}) - \sum_i P_i[c_i(\vec{e}); \lambda_i, v_i] \quad [\text{A.14}]$$

where $C_0$ is the objective, with constraints $c_i(\vec{e}) \geq 0$, and where penalization of violated and near-violated constraints adds to the objective the combined linear and quadratic terms:

$$P_i[c_i(\vec{e}); \lambda_i, v_i] \equiv \frac{v_i}{2}\left(\text{Max}\left[0, \lambda_i - \frac{c_i}{v_i}\right]^2 - \lambda_i^2\right) \quad [A.15]$$

Here $\lambda_i$ is the current estimate of the Lagrange multiplier for the ith constraint, and $v_i$ is a penalty parameter. The $\lambda_i$ and $v_i$ are updated during outer loop iterations. The eq. [A.15] penalty function $P_i$ satisfies $$P_i|_{c_i=0} = 0 \text{ if } \lambda_i = 0, \text{ and} \quad [A.16]$$

$$\left.\frac{dP_i}{dc_i}\right|_{c_i=0} = -\lambda_i$$

The AL evolves to a true Lagrangian when outer loop convergence is complete, and as such contains valid $\lambda_i$ multipliers, though the solution may be deemed acceptable before full convergence has occurred. If the starting solution is feasible, the $\lambda$'s would typically be initialized to 0. The multiplier estimates can be updated in the outer loops by setting $\lambda_{new,i} = (dP_i/dc_i)$. More detailed strategies for initializing and updating the multiplier estimates and penalty parameters in the outer loops are discussed in D. P. Bertsekas, *Nonlinear Programming* (Athena Scientific, 1995), chapter 4. During each set of inner loops the AL is maximized by adjusting e.g. the mask and auxiliary variables while holding the $\lambda_i$ and $v_i$ at their current fixed values. In each inner loop a step is taken towards the maximum based on a calculation of the AL and its gradient, with a current estimate of the second-order Hessian also being employed in a preferred embodiment, e.g. with this estimate being derived using the well-known BFGS method. After maximization, short edges may be deleted and new orthoedges inserted, as will be discussed. In such cases the AL is re-maximized before proceeding to the next outer loop.

Typically the total number of inner loop steps in the full optimization (summed over all outer loops) may be regarded as being roughly independent of mask area, with total iteration counts being, for example, in the range of 20 to 200 depending on problem difficulty and the accuracy sought, and with the number of outer loops being in the range of perhaps 3 to 10. Since the expected number of iterations is limited, the solution algorithm can be expected to achieve near-linear scaling if near-linear scaling can be achieved in the calculation of the AL and its gradient.

The gradient calculation might appear to exhibit a more challenging scaling than calculation of the AL itself, since calculation of the gradient requires that the derivative of the AL be obtained with respect to each problem variable. However, it will now be shown that both the AL and its gradient can be obtained with a computational cost that scales near-linearly with mask area, by following the steps in FIGS. 25 and 26.

The AL is largely a function of the intensity, and it might seem straightforward to obtain with near-linear scaling a sampled map of the intensity that a working solution produces at the wafer, if this sampled map is obtained by using Fast Fourier Transforms (FFTs) to evaluate the convolutions in eq. [A.1]. FFTs achieve near-linear scaling, and can thus provide a bitmap of the intensity with a compute cost that scales near-linearly with mask area. Moreover, the intensity is band-limited with a Nyquist spacing that is typically about 35 nm (though strictly speaking this only applies in the limit of infinite L). The intensity is therefore smooth and somewhat slowly varying, and as a result the intensity at any arbitrary image point can be calculated with a small fixed number of operations by interpolating to the intensity bitmap. Since the total number of constraints is typically proportional to total mask area, the cost of evaluating all $c_i$ by bitmap interpolation therefore has linear scaling, as does subsequent calculation of the AL via eqs. [A.14] and [A.15].

However, a difficulty arises in using FFTs to evaluate the convolutions in eq. [A.1], in that the mask transmission function $m(\vec{x})$ must be defined on a very fine grid in order to meet the stringent control tolerances required in modern lithography. (It should be noted that it is customary to express grid steps in wafer-scale units. Standard masks are 4× enlarged, and physical mask dimensions are actually four times larger than sizes which are quoted in the standard "1×" convention used herein.) A typical mask grid step might, for example, be 0.1 nm to 0.25 nm in wafer-scale units. In contrast, the $\phi_\sigma$ functions are inherently smooth, as follows from their definition as (mutually orthogonal) functions of unit integrated transmission that produce maximal intensity at the geometrical image point, since any discontinuity in a putative $\phi$ distribution would cause unnecessary light loss from diffraction beyond the lens aperture. The grid resolution required to adequately sample the $\phi_\sigma$ becomes finer as $\sigma$ increases, but even for moderately large L a 10 nm grid step will usually be sufficiently fine. Thus, as far as the output intensity I and the $\sigma_\sigma$ kernels are concerned, a 2D FFT of practical size, for example 1024×1024, would be adequate to cover clips or frames that are several microns in size. Unfortunately, given the required fineness of the mask design grid, direct sampling of the mask would nominally require that the FFT be scaled up by one or two orders of magnitude in each dimension, which is not practical.

Fortunately, a more sophisticated sampling enables coarse FFTs to be used in evaluating the convolutions in eq. [A.1], as well as the convolutions with mask derivatives that arise in eq. [A.7], and in addition the gradient of these quantities w.r.t. the problem variables. To derive this sampling method, we first note that the smoothness of each $\phi_\sigma$ allows it to be accurately interpolated between the points of a relatively coarse sampling, for example a 2D grid of sampling points denoted $\vec{x}_k$ that might have a 10 nm spacing. With many standard interpolation functions, e.g. linear, bicubic, or Lagrange polynomial interpolators, an interpolation of $\phi_\sigma$ against such a grid can be written as a short-range convolution $$\varphi_\sigma(\vec{x}) \cong \sum_k^{short} \varphi_\sigma(\vec{x}_k) g(\vec{x} - \vec{x}_k) \quad [A.17]$$

Figure 27A:
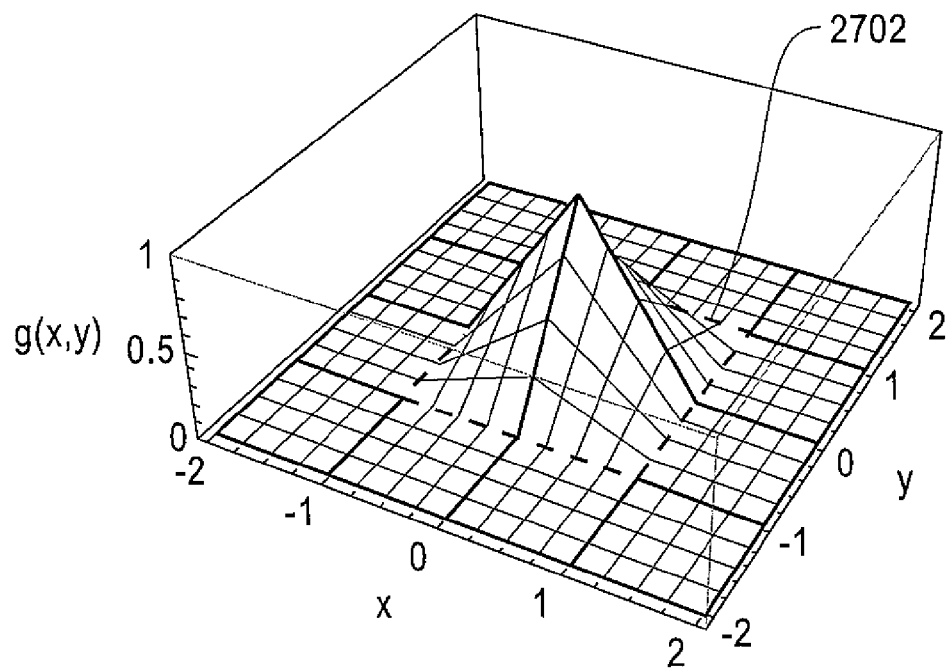
FIGS. 27A and 27B show two examples of interpolating kernels g(x,y) that make it possible for EMF-aware mask optimization to use Fast Fourier Transforms of practical size.
Figure 27B:
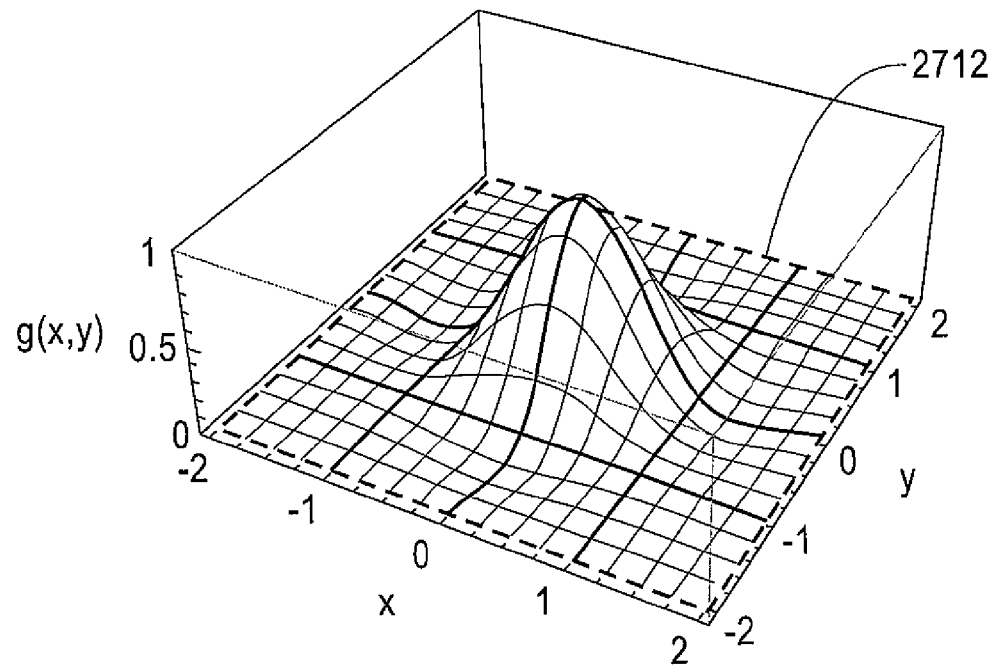

Here g(x,y) denotes the chosen interpolator. The non-standard notation "short" indicates in abbreviated form that the chosen interpolator should preferably have a short range, allowing the value of $\phi_\sigma$ at position $\vec{x}$ to be accurately approximated as a weighted average of the $\phi_\sigma$ values at a limited set of nearby grid-points. The participating grid-points are those in the vicinity of $\vec{x}$. For example, in the familiar case of 1D linear interpolation, g(x) is a triangle function, and eq. [A.17] would express $\phi_\sigma(x)$ as a weighted average of the $\phi$ values at the two grid points closest to x. In 2D, referring to FIG. 27A, the range of k in the case of linear interpolation would extend over 2 grid positions in each axis, i.e. across the span between +1 and −1 grid steps from the interpolation point in each axis. Only the four $\vec{x}_k$ gridpoints that fall within this range will participate in the eq. [A.17] short-range sum when 2D linear interpolation is used. FIG. 27B shows that with bicubic interpolation the k sum would span a 4×4 grid of pixels. In FIG. 27 the dashed rectangles 2702, 2712 show the range of each interpolator.

To apply eq. [A.17] to the problem of mask rasterization for FFTs, we first note that the continuous convolutions of e.g. eq. [A.1] can be re-written as a sum of separate contributions to the convolution from within each pixel of a coarse bitmap. For example, for the boundary layer contribution we have $$\varphi_\sigma * BL \equiv \int\limits_{Mask} d\vec{x}' \, \varphi_\sigma(\vec{x} - \vec{x}') \frac{dm(\vec{x}')}{db} a(\vec{x}') = \quad [A.18]$$

$$\sum_i \int\limits_{\substack{Within \\ pixel\ i}} d\vec{x}' \, \varphi_\sigma(\vec{x} - \vec{x}') \frac{dm(\vec{x}')}{db} a(\vec{x}')$$

where $d\vec{x}'$ denotes a differential element of mask area. The function $\phi_o$ only varies slowly over each pixel i, but the finely-structured mask BL includes significant content at spatial frequencies far higher than the reciprocal of the grid spacing.

The term $\phi_o(\vec{x} - \vec{x}')$ in the right-hand integral can be regarded as a function of the two variables $\vec{x}$ and $\vec{x}'$, and if we interpolate with respect to only the $\vec{x}'$ variable using eq. [A.17], we have $$\varphi_\sigma(\vec{x} - \vec{x}') \cong \sum_k^{short} \varphi_\sigma(\vec{x} - \vec{x}'_{i+k}) g(\vec{x}' - \vec{x}'_{i+k}), \quad [A.19]$$

where i is the index of the pixel $\vec{x}_i'$ that is closest to $\vec{x}'$.

Figure 28A:
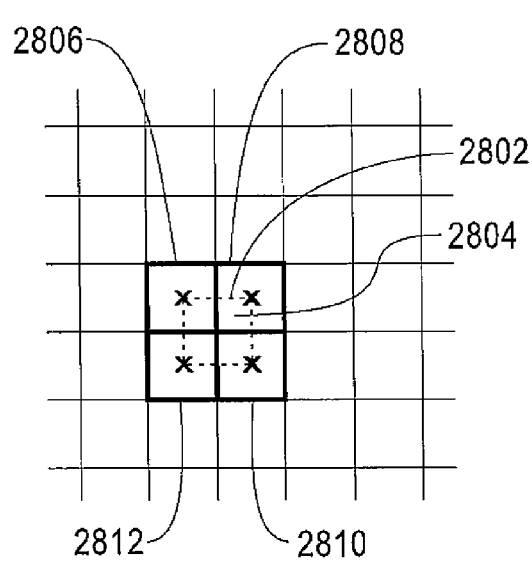
FIGS. 28A, 28B, 28C, and 28D show how interpolation can be used to approximate the value of smooth optical kernels using samples on a discrete array of grid points.

The range of the summation in eq. [A.19] may be understood by referring to FIGS. 28A to 28D, which assume the simple linear interpolating g(x,y) of FIG. 27A. This interpolator spans a 2×2 grid of pixels. FIG. 28A shows that such an interpolator represents the $\phi_o$ value at any point within the dotted rectangle 2802, such as the point 2804, by a weighted average of the $\phi_o$ values obtaining at four pixels 2806, 2808, 2810, 2812 of a coarse bitmap sampling of $\phi_o$. More precisely, $\phi_o$ at an interpolation point like point 2804 is well-approximated by a weighted average of the discrete $\phi_o$ values at the centers of the four pixels 2806, 2808, 2810, 2812, as indicated by the "x" grid markers.

Figure 28B:
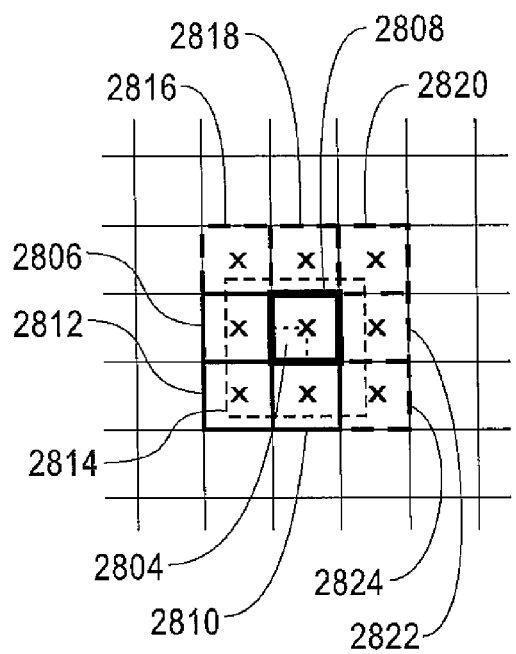
Figure 28C:
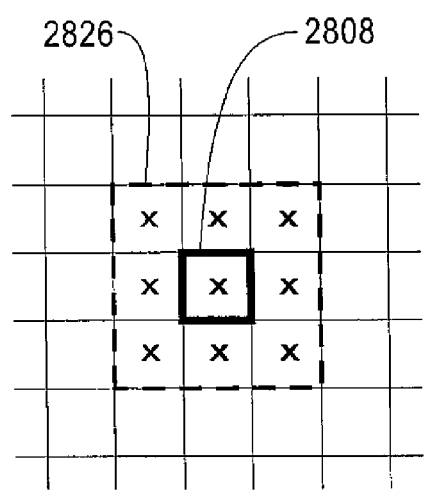
Figure 28D:
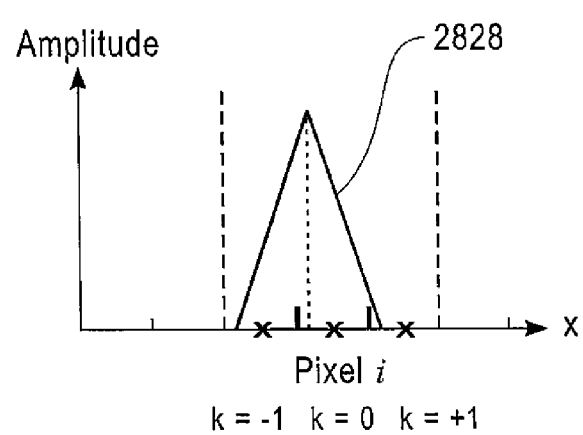

FIG. 28B considers the interpolation of $\phi_o$ values at all points within some particular single pixel, for example the ith, pixel 2808. Points within the lower left quadrant of the ith pixel are mapped to the four grid points, indicated by the "x" grid markers in FIG. 28A. This also follows from the convolution in eq. [A.17], since, as may be seen in FIG. 27A, the g(x,y) function only has non-zero support within a 2×2 grid of pixels. FIG. 28B shows as a dashed rectangle 2814 this 2×2 extent of non-zero g(x,y) for the case of linear interpolation to the point 2804. Only the four grid points, indicated by the "x" grid markers in FIG. 28A, are within the range of g(x,y) in this case. However, g(x,y) is considered to be zero-valued outside its 2×2 non-zero support, and eq. [A.17] can thus continue to be applied when interpolating to points that lie within the remaining 3 quadrants of the ith pixel 2808 (i.e. besides the lower left quadrant already considered). This has the effect of causing other grid-points to participate within weighted averages to interpolated $\phi_o$ values at points within the full span of the ith pixel. In particular, the grid points at the centers of the pixels 2816, 2818, 2820, 2822, 2824 shown with dashed boundaries in FIG. 28B contribute, along with the grid points already considered for pixels 2806, 2808, 2810, 2812. FIG. 28C then shows that with linear interpolation we may interpret the sum over k in eq. [A.19] as extending over the 3×3 grid of pixels within the dashed rectangle 2826, this range being one pixel larger in each axis that the support-width of g(x,y). This extended sum range would be expanded to a 5×5 grid if the bicubic interpolator of FIG. 27B were used. To further illustrate these considerations, FIG. 28D shows the same elements as FIGS. 28A, 28B, and 28C in the simpler case of 1D patterns. In 1D the linear interpolator g(x) becomes a simple triangle function, as shown by triangle 2828, and the index i may be interpreted as the global integer pixel number along the x axis. In 1D the index k simply represents a position increment along the x axis, and in the case of linear interpolation k ranges from k=−1 to k=+1.

In this 1D case the "i+k" subscript on $\vec{x}'$ in eq. [A.19] should be interpreted as literally a sum of index values. However, in the general 2D case it should be understood that "i+k" actually represents the global bitmap index of some pixel in the neighborhood of pixel i that contributes to the interpolation, while k is a local index that ranges, for example, through the nine 2D neighbors of the pixel that is located at the center of the 3×3 range. Thus, in 2D the "i+k" notation does not literally indicate a summation, but rather a reference to the kth pixel in the short-range neighborhood surrounding pixel i, e.g. "i+k" indicates one of the 9 pixels within the dashed rectangle 2826 in FIG. 28C, with pixel i being the pixel 2808 at the center of the dashed rectangle 2826.

Bearing these interpretations in mind, we substitute from eq. [A.19] into [A.18] and switch the order of summation and integration, to obtain $$\varphi_\sigma * BL \cong \quad [A.20]$$

$$\sum_i \sum_k^{short} \left[ \varphi_\sigma(\vec{x} - \vec{x}'_{i+k}) \int\limits_{\substack{Within \\ pixel\ i}} d\vec{x}' g(\vec{x}' - \vec{x}'_{i+k}) \frac{dm(\vec{x}')}{db} a(\vec{x}') \right]$$

Eq. [A.20] has a double-sum structure that results from an expansion of the basic convolution by means of an interpolation. The outer summation index i in eq [A.20] runs over all pixels in the mask. For each value of i, the integral maps the extended BL content within the ith pixel to the kth neighboring discrete grid point in the set shown in FIG. 28C (or FIG. 28D in the 1D case). This mapped BL content then becomes a weight increment for the sampled optical kernel value at the grid point, this sampled value being the factor $\phi_o(\vec{x} - \vec{x}'_{i+k})$ in eq. [A.20]. As discussed, the index "i+k" that identifies the particular grid point should only be interpreted as a literal sum in the case of 1D patterns. It should also be noted that each grid point will neighbor many pixels, so the sampled optical kernel value at any particular grid point will receive contributions from a number of different evaluations of the integral that occur during different i,k combinations in the double-sum. For example, in a simple 1D example, the jth grid point in the array of grid values $\phi_o(\vec{x} - \vec{x}_j')$ will receive a contribution from any (i,k) term in the double-sum for which j=i+k.

Next, the eq. [A.20] double-sum is re-organized. This is done by switching the outer sum index from variable i, which represents the ith pixel's contribution to the basic convolution in eq. [A.18], to a new index j, which accumulates all neighboring contributions that map into the jth gridpoint in the double-sum. In 1D the re-organized double-sum simply replaces the summation over index i with a summation over a new index j defined as j i+k. More generally, the eq. [A.20] sum is reorganized such that the double-sum term for each combination of values of k and of the new index j is the term which in the eq. [A.20] double-sum mapped to the grid point j, i.e. to the grid point which when referenced by the "i+k" index of $\vec{x}_{i+k}'$ was grid point j. Re-organized in this way, eq. [A.20] becomes:

$$\varphi_\sigma * BL \cong \sum_j \left[ \varphi_\sigma(\vec{x} - \vec{x}_j') \sum_k^{short} \int_{\substack{Within \\ pixel\ j\text{-}k}} d\vec{x}' g(\vec{x}' - \vec{x}_j') \frac{dm(\vec{x}')}{db} a(\vec{x}') \right] \quad [A.21]$$

Figure 29A:
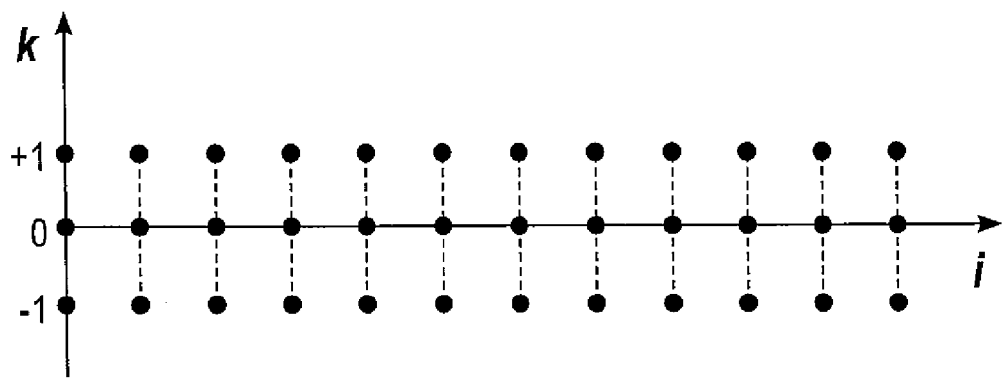
FIGS. 29A and 29B illustrate two different ways to assign the per-pixel contributions of boundary layers and other extended mask elements to a discrete array of grid points, so that Fast Fourier Transforms can be used to carry out efficient convolutions.
Figure 29B:
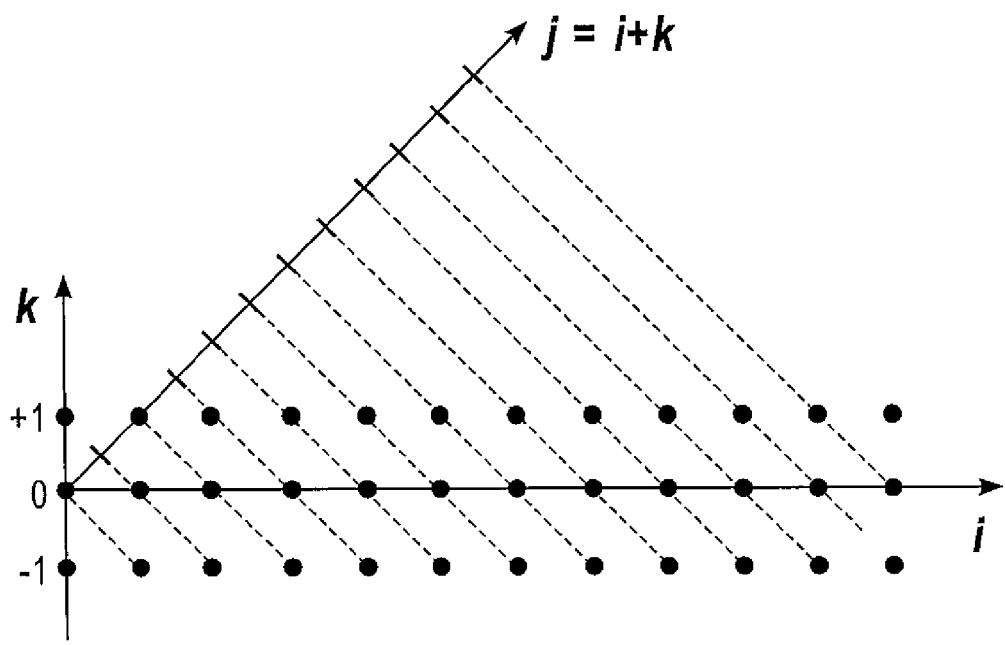

Here the reference to pixel "j-k" in the integral range should only in the 1D case be literally interpreted as the pixel whose index is the numerical difference between the j and k index values. More generally, the integral ranges over that pixel which maps to grid point j for the given value of k (this having been pixel i in the previous eq. [A.20] ordering). FIG. 29 illustrates the reorganization of eq. [A.20] to eq. [A.21] in schematic form, using the simple 1D case with linear interpolation as an example, with FIG. 29A being a schematic representation of the organization of the double-sum in eq. [A.20], while FIG. 29B shows the re-indexing in eq. [A.21]. Though organized differently, the same terms are included in each double-sum; these are shown as dots in FIGS. 29A and B. In the eq. [A.20] outer sum the index i ranges over all pixels in the bitmap gridding of the mask. The inner index k is short-range, i.e. in the simple example of linear interpolation with 1D patterns, the index k of the inner sum ranges from −1 to +1, as shown in FIG. 29. Thus, the double-sum in eq. [A.20] entails three separate integrations for each value of i in this simple example. Per eq. [A.20], the integral for the i,k entry in the double-sum becomes a weighting factor for the $\phi_o$ value at gridpoint i+k in the 1D case. Each integration in the eq. [A.20] double-sum is thus represented schematically by a dot in FIG. 29. FIG. 29B shows that these integral evaluations can be reorganized into a different double-sum, where the inner index k remains unchanged, but where the outer index j represents the grid point for which the integral represents a weighting factor, this being the integral within that pixel whose index along the x axis has the value j-k in the simple 1D case.

To simplify further derivations, a notation is next introduced in which $[[BL]]_k(j) = [[a\ dm/ab]]_k(j)$ denotes the value of the integral in eq. [A.21] for index values j,k, and where $[[BL]](j) = [[a\ dm/ab]](j)$ denotes the result of summing these values over all k. Often the argument "(j)" will not be shown explicitly, i.e. for simplicity we may simply write $[[a\ dm/ab]]$ or $[[BL]]$.

The eq. [A.21] continuous convolution of an optical kernel with the BL can then be recast as follows:

$$\varphi_\sigma * BL \equiv \int_{Mask} d\vec{x}' \varphi_\sigma(\vec{x} - \vec{x}') \frac{dm(\vec{x}')}{db} a(\vec{x}') \quad [A.22]$$

$$\cong \sum_j \left[ \varphi_\sigma(\vec{x} - \vec{x}_j') \sum_k^{short} \int_{\substack{Within \\ pixel\ j\text{-}k}} d\vec{x}' g(\vec{x}' - \vec{x}_j') \frac{dm(\vec{x}')}{db} a(\vec{x}') \right]$$

$$= \sum_j \left( \varphi_\sigma(\vec{x} - \vec{x}_j') \sum_k^{short} \left[ \left[ \frac{dm(\vec{x}')}{db} a(\vec{x}') \right] \right]_k (j) \right)$$

$$\sum_j \left( \varphi_\sigma(\vec{x} - \vec{x}_j') \left[ \left[ \frac{dm(\vec{x}')}{db} a(\vec{x}') \right] \right] (j) \right)$$

$$\equiv \varphi_\sigma \otimes \left[ \left[ \frac{dm(\vec{x})}{db} a(\vec{x}) \right] \right]$$

where the symbol "⊗" denotes discrete convolution. Eq. [A.22] thus shows how the continuous convolution of an optical kernel with the finely-structured mask BL can accurately be written as a discrete convolution over a grid of points that is coarsely spaced; this is accomplished by exploiting the relative smoothness of the optical kernels. This smoothness allows a short-range interpolating kernel to be introduced into the convolution integral, and the above derivation shows how the operation of the interpolator can essentially be transferred to act on the highly non-smooth BL. The resulting "bed-of-nails" representation of the BL can be quite coarse compared to the mask design grid and to the typical dimensional tolerances involved in the lithographic printing process (which may be, for example, of sub-1 nm scale), and as a result the associated discrete convolutions can be carried out very efficiently using FFTs of practical size, which achieve near-linear scaling with mask area.

It should also be noted that the integrals along the BL which occur within the j-k pixels in eq. [A.22] are quite sparse. With a typical grid spacing of, for example, 10 nm, most pixels will contain no boundary edges. Most of the remaining pixels which do have BL content will only contain a single edge segment. The interpolator g is typically a polynomial, and its integral along an edge segment can be efficiently carried out on the fly using elementary analytic expressions. Alternatively, small stored tables may be used to evaluate the integral along each segment.

This general interpolation-based method for representing extended mask content as a coarse array of discrete samples, which we refer to as a coarse mask rendering, can be used to achieve near-linear scaling in other convolutions that involve mask-related quantities, such as the first thin-mask (TMA) term in eq. [A.1], i.e.

$$I_{TMA}(\vec{x}) \equiv \sum_{\sigma=1}^L |\varphi_\sigma * m(\vec{x})|^2 \quad [A.23]$$

$$\cong \sum_{\sigma=1}^L |\varphi_\sigma \otimes [[m(\vec{x})]]|^2$$

$$\equiv \sum_{\sigma=1}^L |K_{m,\sigma}|^2$$

A further notational simplification has been introduced in the second line of eq. [A.23], where a compact expression $K_{m,\sigma}$ has been used to denote the discrete convolution of the mask with the σth optical kernel. The dependence of $K_{m,\sigma}$ on the output point $\vec{x}$ has been suppressed for simplicity. Similar notation can also be used to denote the BL convolution in eq. [A.22]. More specifically, we use a dot to concisely indicate d/db, and then introduce further K notation to abbreviate eq. [A.22] as $$\varphi_\sigma * \dot{BL} \cong \varphi_\sigma \otimes \left[\left[\frac{dm(\vec{x})}{db}a(\vec{x})\right]\right] \equiv K_{\dot{m}a,\sigma} \quad [A.24]$$

Figure 25:
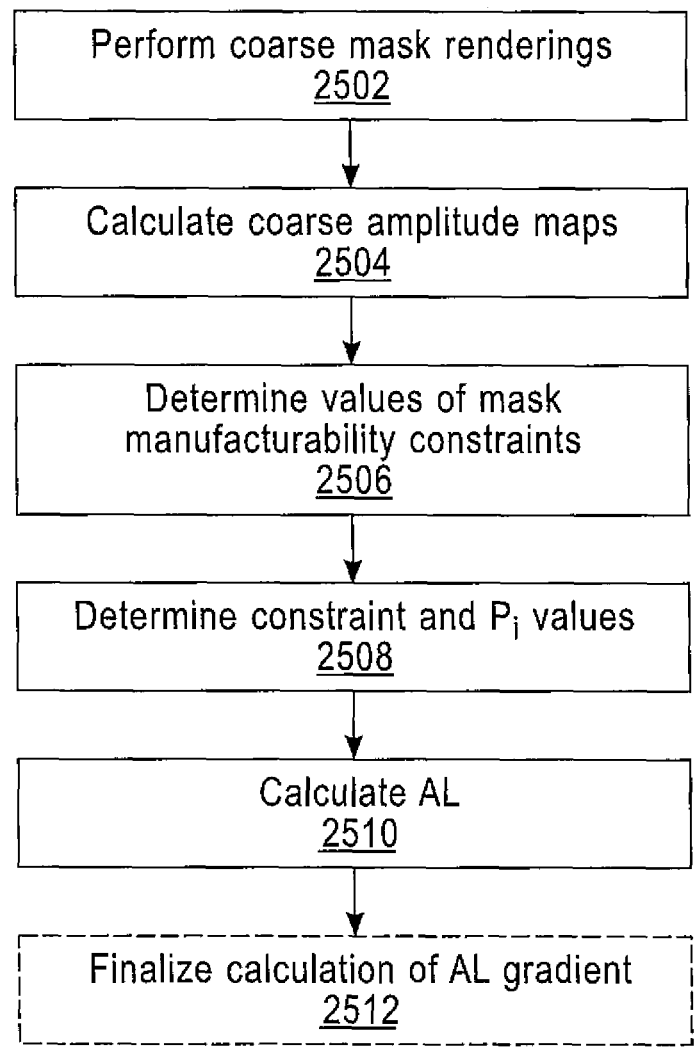
FIG. 25 shows a procedure for efficiently carrying out the image-based calculations needed to achieve near-linear scaling when optimizing large mask areas.

We refer to these K quantities as coarse amplitude bitmaps. Referring to FIG. 25, the first step 2502 in a preferred method for calculating amalgamated optimization functions like the AL, and for calculating the gradient of these functions, is to generate coarse mask renderings using the [[ ]] operation, and the second step 2504 is to carry out discrete convolutions of these renderings with the optical kernels, to obtain a set of coarse amplitude maps.

Before explaining these steps in more detail, it is worth noting that the above derivation of accurate coarse mappings continues to hold if $\phi_\sigma(\vec{x})$ is replaced with the Fourier transform of the circular bandlimit of the optical system (as extended by the circular illumination aperture), since the optical impulse response function is smooth to at least the same degree as the optical kernels. Denoting this impulse response as $h(\vec{x})$, it follows that (coarsely) Fourier transforming the coarsely rendered convolution of h with a function like $m(\vec{x})$ will produce that portion of the Fourier transform of m which falls within the bandwidth of the optical system. In the present notation, this Fourier transform calculation is expressed as FFT([[m]]). Moreover, the above analysis then shows that the conventional transform FFT(m) can only match the accuracy of FFT([[m]]) if the former FFT uses a much finer sampling. The above interpolation-based method thus constitutes an efficient way to calculate the optically relevant portion of the Fourier transform of m using a much smaller FFT than would be needed for the direct method. Note too that the neglected Fourier components are completely irrelevant to the imaging process, since the optical system does not collect them.

Under some circumstances it is worthwhile to further generalize the K notation by using a simple index n to distinguish the different kinds of K maps that may appear in a given expression. For example, the basic intensity calculation in eq. [A.1] can be written more concisely as $$I(\vec{x}) = \sum_{\sigma=1}^{L} |K_{m,\sigma} + K_{\dot{m}a,\sigma}|^2 \equiv \sum_{\sigma=1}^{L} \left|\sum_{n=1}^{2} K_{n,\sigma}\right|^2 \quad [A.25]$$

which can also be written as $$I(\vec{x}) = \sum_{\sigma=1}^{L} \sum_{n'=1}^{2} \sum_{n''=1}^{2} K_{n',\sigma} K_{n'',\sigma}^*$$

As in earlier equations, the dependence of the K maps on the output point $\vec{x}$ has not been explicitly shown in eq. [A.25]. Eq. [A.25] and subsequent equations adopt the notational simplification of omitting explicit indication of the focal plane z involved in a given intensity calculation.

The K notation is also useful when evaluating terms in the AL that involve derivatives of the mask. For example, to evaluate the bias term dI/db that occurs in the eq. [A.7] MEEF constraint, we have from eq. [A.25] that $$\frac{dI}{db} = 2\sum_{\sigma=1}^{L}\sum_{n'=1}^{2}\sum_{n''=1}^{2} \text{Re}\left[\frac{dK_{n',\sigma}}{db}K_{n'',\sigma}^*\right] \quad [A.26]$$

It should be understood that the differentiation in eq. [A.26] is undertaken on the continuous convolutions before the interpolation-based reduction to a discrete grid is carried out. We have from eqs. [A.10], [A.12], and [A.25] that the derivative terms in eq. [A.26] are specifically given by $$\begin{aligned}\frac{dK_{m,\sigma}}{db} &= \int_{Mask} d\vec{x}' \varphi_\sigma(\vec{x}-\vec{x}') \frac{dm(\vec{x}')}{db} \\ &\cong \varphi_\sigma \otimes \left[\left[\sum_q \dot{\delta}(\vec{x}-\vec{x}_q)\right]\right] \\ &\equiv K_{\dot{m},\sigma}\end{aligned} \quad [A.27]$$

and $$\frac{dK_{\dot{m}a,\sigma}}{db} \cong \varphi_\sigma \otimes \left[\left[\sum_q a_q \begin{pmatrix} \eta_q \dot{\delta}(\vec{x}-\vec{x}_q) + \\ \xi(\vec{x}_{q,q-1})\dot{\delta}(\vec{x}-\vec{x}_{q,q-1}) + \\ \xi(\vec{x}_{q,q+1})\dot{\delta}(\vec{x}-\vec{x}_{q,q+1}) \end{pmatrix}\right]\right] \quad [A.28]$$

$$\equiv K_{\dot{m}a,\sigma}$$

It will be understood by those of reasonable skill in the art that expressions of the eq. [A.25],[A.26] form can be derived for any quantity that involves an integral or derivative of the intensity w.r.t. an external parameter, and further, that a wide range of quantities which are quadratic in the mask content may similarly be calculated by using alternative kernels to the $\phi_\sigma$. We will use the notation $\tilde{I}$ to denote quantities from this general set, such as I and dI/db.

An algorithm that uses eqs. [A.25]-[A.28] to calculate the AL and its gradient must take into account the fact that the K terms and resulting $\tilde{I}$ terms will only be available on a discrete grid of points when calculated with FFTs. However, interpolation can then be used to obtain the values of $\tilde{I}$ quantities like I and dI/db at other points, such as at the sample points shown in FIG. 24, and these interpolations can be quite accurate even with a moderately coarse grid, due to the smoothness of the bandlimited intensity distribution. We will use the symbol t to denote the interpolation coefficients employed in such operations. Note that intensity slopes, like the dI/dx, term in eq. [A.7], can also be expressed as a weighted sum of $\tilde{I}$ samples by using a differentiating interpolator (which is basically just the derivative of a standard interpolator). In equations that make use of t coefficients it should be understood that the interpolator involved may be differentiating; this will not generally be indicated explicitly.

Individual constraints in the AL, such as those in eqs. [A.3] and [A.7], may involve more than one instance of the various $\tilde{I}$, though to achieve near-linear scaling the number of instances in each (or almost every) constraint should preferably be kept small, with exceptions only being allowed in a small fixed set of constraints. The linear coefficients that multiply the different instances of the $\tilde{I}$ in any one constraint equation will be designated $f_\nu$, with v being an index that distinguishes the different coefficients in the constraint. Using p as an index for the output grid points at $\vec{x}=\vec{x}_p$ on which the discrete coarse amplitude maps K are obtained, we can then express each constraint in the SMO problem statement in the general form $$c_i(\vec{e}) \geq 0, \qquad [A.29]$$

where $$c_i(\vec{e}) = d_i + \sum_v^{short} \sum_p^{short} f_{v,i} I_{v,i,p} \tilde{I}_p$$

where $\tilde{I}_p$ denotes the value of an intensity-like quantity at grid point p, and where $d_i$ denotes any quantities in the constraint that do not depend in a direct way on the intensity or the edge variables; for example, $d_i$ might represent an auxiliary w variable, or a constant term.

Referring to FIG. 25, such a calculation of the constraints (by using eq. [A.29]), and then the $P_i$ values (by using eq. [A.15]), constitutes a next block in the diagrammed procedure for determining the AL and its gradient. As previously discussed, constraints on mask manufacturability need not be represented in the eq. [A.29] set; instead, they (and their gradient) may be calculated with near-linear scaling by using the method described in U.S. Publication No. US 2013/0019211 A1. Per FIG. 25, the method of U.S. Publication No. US 2013/0019211 A1 provides values for the mask manufacturability constraints, which in turn yield their associated non-optical contributions to the AL via $P_i$ values (through eq. [A.15]).

Aside from mask manufacturability terms, the eq. [A.14] AL (which more precisely is the optical part of the AL) can now be written as $$AL \equiv C_0(\vec{e}) - \qquad [A.30]$$

$$\sum_i P_i \left[ \left( d_i + \sum_v^{short} \sum_p^{short} \sum_{\sigma=1}^{L} \sum_{n'=1}^{short} \sum_{n''=1}^{short} f_{v,i} I_{v,i,p} K_{n',\sigma}(p) K^*_{n'',\sigma}(p) \right); \right]_{\lambda_i,\, v_i}$$

where the dependence of K on the index p of the output grid point is now shown explicitly.

Calculation of the K terms in eq. [A.30] (the coarse amplitude maps) has a computational cost that scales near-linearly with area. Once these maps are obtained, the cost of carrying out the inner sums in eq. [A.30] involves a relatively small fixed number of operations for each value of i, as does calculation of the penalty value $P_i$ via eq. [A.15]. Calculation of $C_0$ via eq. [A.2] then involves only a small fixed number of operations. The number of terms in the eq. [A.30] outer sum over i equals the total number of constraints, and so scales linearly with mask area. Thus, the total cost of calculating the optical AL via eq. [A.30] exhibits the desired near-linear scaling. The $P_i$ contributions from manufacturability constraints can likewise be added with near-linear scaling.

Optimization algorithms typically require gradient information in order to converge to a solution within a reasonable number of iterations, and near-linear scaling is ostensibly harder to achieve in the gradient calculation than in calculation of the AL itself, since the gradient includes the derivative of the AL with respect to every mask variable, and the total number of mask variables will itself scale linearly with mask area. This represents a basic difficulty in the gradient calculation, but this difficulty can be overcome by means next discussed. The gradient calculation step will make use of the coarse amplitude maps involved in the AL, but to calculate the gradient with near-linear scaling some finalization steps are needed, which together constitute the last block 2512 in the FIG. 25 flow.

Figure 26:
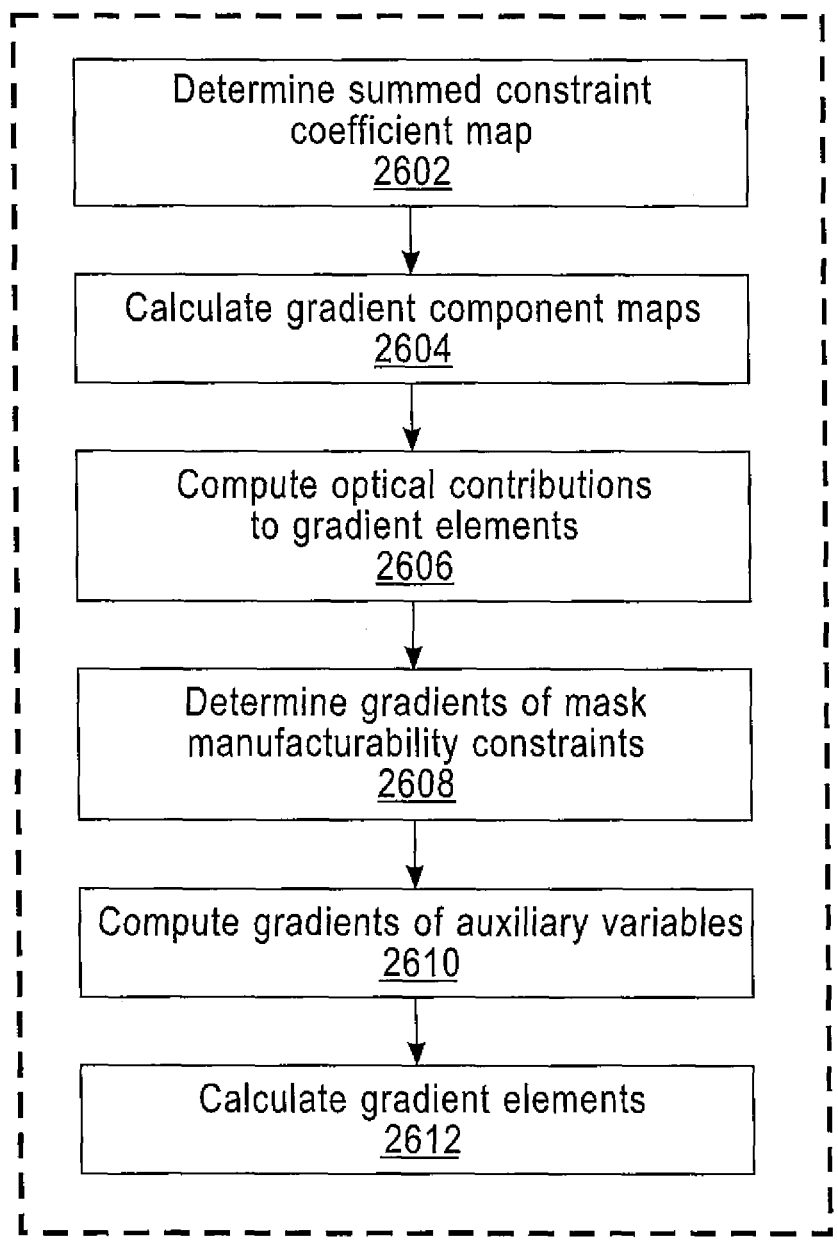
FIG. 26 shows more detailed sub-steps within a gradient calculation block in FIG. 25.

Preferred sub-steps in this block are listed in FIG. 26. The FIG. 26 strategy overcomes the basic difficulty of the gradient calculation by using FFTs to calculate a set of gradient component maps from which each derivative with respect to an individual edge can then be computed as a short-range integration within the maps, with these short-range integrations each involving only a small fixed number of operations, as will be discussed.

The gradient is typically structured as a vector or list of the AL derivatives with respect to all problem variables, and it may be convenient to list the mask variable derivative elements first, and then the derivatives with respect to any auxiliary variables that may be used. Considering first the gradient w.r.t. mask variables, each such gradient element will be a derivative of the AL w.r.t. a mask variable $e_q$, where $e_q$ represents the position of the qth mask edge along the coordinate perpendicular to its extent. Key building blocks in calculating these derivatives are the derivatives of the $\tilde{I}$ quantities, which per eq. [A.25] have the general form $$\frac{d\tilde{I}}{de_q} = 2\sum_{\sigma=1}^{L}\sum_{n'=1}^{short}\sum_{n''=1}^{short} \mathrm{Re}\left[\frac{dK_{n',\sigma}}{de_q} K^*_{n'',\sigma}\right] \qquad [A.31]$$

$$\equiv 2\sum_{\sigma=1}^{L}\sum_{n'=1}^{short}\sum_{n''=1}^{short} \mathrm{Re}[K'_{n',\sigma} K^*_{n'',\sigma}]$$

where in the second line a prime has been introduced on one of the K terms as a compact notation that in general designates the derivative of any coarse amplitude map K with respect to an edge $e_q$. It is understood that these derivatives are carried out on the continuous convolutions before rendering to coarse bitmaps.

The derivative of a continuous convolution w.r.t. the position of an edge essentially reduces to an integral along the edge, with additional terms arising at the endpoints when the convolution involves bias derivatives. For example, when edge q is vertical, we have that the derivative w.r.t. edge q of the coarse amplitude map for the TMA mask $m(\vec{x})$ is $$K'_{m,\sigma}(\vec{x}) \equiv \left[\left[\frac{d}{de_q}\int d\vec{x}'\, \varphi_\sigma(\vec{x}-\vec{x}')m(\vec{x}')\right]\right] \qquad [A.32]$$

$$= \left[\left[\int_{Edge\ q} dy'\, \varphi_\sigma(x-x'_q,\ y-y')\right]\right]$$

with a similar expression holding for horizontal edges. Here $d\vec{x}'$ denotes as usual a differential element of mask area, while dy' denotes a differential length element along the vertical edge.

In eq. [A.32] the coarse mapping operation is only indicated symbolically, using the [[ ]] notation. Looked at in more explicit detail, the [[ ]] coarse rendering operation that is used in obtaining the K' edge derivative coarse maps has a similar structure to that used in calculating the K coarse amplitude maps, except that for convenience the [[ ]] operation is considered to include the discrete convolution with $\phi_0$ whenever an edge derivative is involved (i.e. in the K' maps), whereas the ordinary K maps are calculated by carrying out the $\phi_o$ convolution after the [[ ]] coarse rendering has been carried out. More specifically, and paralleling the development in eq. [A.22] and preceding discussion, the coarse mapping operation for a K' edge derivative coarse map renders edge integrals like that in eq. [A.32] to a discrete map by using an interpolator g:

$$\int_{Edge\ q} dy' \varphi_\sigma(x - x'_q, y - y') = \sum_i \int_{\substack{Edge\ q \\ within \\ pixel\ i}} dy' \varphi_\sigma(x - x'_q, y - y') \quad [A.33]$$

$$\cong \sum_j \left[ \varphi_\sigma(\vec{x} - \vec{x}'_j) \sum_k^{short} \int_{\substack{Edge\ q \\ within \\ pixel\ j\text{-}k}} dy' g\left(\begin{matrix} x'_j - x'_q, \\ y'_j - y' \end{matrix}\right) \right]$$

$$\equiv \left[\left[ \int_{Edge\ q} dy' \varphi_\sigma(x - x'_q, y - y') \right]\right]$$

$$\equiv K'_{m,\sigma}(\vec{x})$$

Other coarse derivative bitmaps may be similarly calculated. For example, in the case of vertical edges, we have $$K'_{\acute{m},\sigma} = \left[\left[ \eta_q \left( \int_{Edge\ q} dy' \frac{d\varphi_\sigma(x - x'_q, y - y')}{dx'_q} + \xi(\vec{x}_{q,q-1})\delta(\vec{x} - \vec{x}_{q,q-1}) + \xi(\vec{x}_{q,q+1})\delta(\vec{x} - \vec{x}_{q,q+1}) \right) \right]\right] \quad [A.34]$$

with a similar expression obtaining for horizontal edges.

The [[ ]] coarse rendering operation for derivatives of the kernels, like that for $d\phi_o/dx_q$ in eq. [A.34], can usefully be cast as a mapping to the sampled kernel itself, rather than to its derivative. For example, the $d\phi_o/dx_q$ coarse rendering term in eq. [A.34] can be written $$\int_{Edge\ q} dy' \frac{d\varphi_\sigma\left(\begin{matrix} x - x'_q, \\ y - y' \end{matrix}\right)}{dx'_q} \cong \quad [A.35]$$

$$\sum_i \sum_k^{short} \left( \int_{\substack{Edge\ q \\ within \\ pixel\ i}} dy' \frac{d\left[\varphi_\sigma(\vec{x} - \vec{x}'_{i+k}) g\left(\begin{matrix} x'_{i+k} - x'_q, \\ y'_{i+k} - y' \end{matrix}\right)\right]}{dx'_q} \right) =$$

$$\sum_i \sum_k^{short} \left( \int_{\substack{Edge\ q \\ within \\ pixel\ i}} dy' \frac{\varphi_\sigma(\vec{x} - \vec{x}'_{i+k}) dg\left(\begin{matrix} x'_{i+k} - x'_q, \\ y'_{i+k} - y' \end{matrix}\right)}{dx'_q} \right) =$$

$$\sum_j \left( \varphi_\sigma(\vec{x} - \vec{x}'_j) \sum_k^{short} \int_{\substack{Edge\ q \\ within \\ pixel\ j\text{-}k}} dy' \frac{dg\left(\begin{matrix} x'_j - x'_q, \\ y'_j - y' \end{matrix}\right)}{dx'_q} \right) \equiv$$

$$\left[\left[ \int_{Edge\ q} dy' \frac{d\varphi_\sigma\left(\begin{matrix} x - x'_q, \\ y - y' \end{matrix}\right)}{dx'_q} \right]\right]$$

The third line in eq. [A.35] indicates that the coarse mapping of the kernel derivative can be expressed in terms of samples of the kernel itself, by using a differentiating interpolator dg/dx. The interpolation order of the chosen g can be increased in order to maintain accuracy after the derivative is taken. In equations subsequent to eq. [A.35], the possibility of using a differentiating interpolator may not be indicated explicitly. In general, when bitmap grid points are indexed by r, we will write the interpolator used to obtain any general derivative $K_{n,o}'$ w.r.t. edge q as $g_{r,q,n}$, where $$K'_{n,\sigma}\big|_{\vec{x}=\vec{x}_p} = \sum_r^{short} g_{r,q,n} \varphi_\sigma(\vec{x}_p - \vec{x}_r) \quad [A.36]$$

Here $g_{r,q,n}$ can denote either a standard or a differentiating interpolator. Note that the range of r can be assumed short for each particular edge q, as long as the length of edge q has a typical size that does not (on average) increase with the total area of the mask regions being optimized. This reflects the usual situation where the average length of a mask polygon edge is determined by IC groundrules, and by the optical resolution (more particularly, by the need for mask edges to usually be shorter than the optical resolution in order to allow adjustment of these mask edges to provide fine control over the position of printed feature edges along the entire feature length), and where the total number of mask edges increases linearly with total area. In other words, in the usual situation where the average local mask edge density does not increase with total area, we may treat the range of r as short. A near-exception to this general rule arises when mask edges are highly extended, for example when their length exceeds the width of the optimization clip or clips. However, in such situations the total number of edges will increase sub-linearly, leaving the total computational burden unchanged from that in the more usual scenario. For simplicity eq. [A.36] assumes a short edge length in writing the limit on the r sum.

Other coarse derivative amplitude maps that are preferably included in the AL gradient arise during differentiation of the BL. For example, we have $$K'_{ma,\sigma} = \left[\left[ \eta_q \left( a_q \int_{Edge\ q} dy' \frac{d\varphi_\sigma(x - x'_q, y - y')}{dx'_q} + a_{q-1}\xi(\vec{x}_{q,q-1})\delta(\vec{x} - \vec{x}_{q,q-1}) + a_{q+1}\xi(\vec{x}_{q,q+1})\delta(\vec{x} - \vec{x}_{q,q+1}) \right) \right]\right] \quad [A.37]$$

and

-continued $$K'_{\vec{m}a,\sigma} = \begin{bmatrix} \eta_q a_q \int_{Edge\ q} dy' \frac{d^2 \varphi_\sigma(x-x'_q, y-y')}{dx'^2} + \\ a_{q-1}\eta_{q-1}\eta_q \frac{d\delta(\vec{x}-\vec{x}'_{q,q-1})}{dy'} + \\ a_{q+1}\eta_{q+1}\eta_q \frac{d\delta(\vec{x}-\vec{x}'_{q,q+1})}{dy'} + \\ \xi(\vec{x}_{q,min})[a_{q-1}+a_q]\frac{d\delta(\vec{x}-\vec{x}'_{q,min})}{dx'} + \\ \xi(\vec{x}_{q,max})[a_q+a_{q+1}]\frac{d\delta(\vec{x}-\vec{x}'_{q,max})}{dx'} \end{bmatrix}$$ [A.38]

where for brevity only the results for vertical edges have been listed. Note that these expressions have the general form of eq. [A.36] after the coarse rendering and coarse mapping operations are explicitly carried out.

These K' coarse derivative maps can next be used to efficiently express the AL gradient. Combining eqs. [A.30], [A.31], and the expressions above for the various K' maps which all maintain the general form in eq. [A.36], we have that the edge-variable elements of the AL gradient can be written $$\frac{\partial AL}{\partial e_q} = -2 \sum_i \sum_p \sum_\sigma^L \sum_v^{short} \sum_r^{short} \sum_{n'=1}^{short} \sum_{n''=1}^{short} \dot{P}_i$$ [A.39]

$$t_{v,i,p} f_{v,i} g_{r,q,n'} \text{Re}\begin{bmatrix} K^*_{n'',\sigma}(\vec{x}_p) \\ \varphi_\sigma(\vec{x}_p - \vec{x}_r) \end{bmatrix}$$

Here P represents dP/dc, with P(c) given by eq. [A.15]. For simplicity it has been assumed that the objective $C_o$ has a form like eq. [A.2] that does not depend directly on the edge variables in $e_q$. In contrast to eq. [A.30], the sum over p in eq. [A.39] has not been treated as short-range, since it will prove convenient to switch the order of summations over i and p.

Eq. [A.39] is nominally quite complicated, but it can be evaluated with a sequence of operations that exhibit linear or near-linear scaling. Referring to FIG. 26, the first sub-step in this sequence is to carry out the summation over the constraints i, providing what we refer to as a summed constraint coefficient map G:

$$G_p \equiv -2 \sum_i \sum_v^{short} \dot{P}_i t_{v,i,p} f_{v,i}$$ [A.40]

so that $$\frac{\partial AL}{\partial e_q} = \sum_\sigma^L \sum_p \sum_r \sum_{n'=1}^{short} \sum_{n''=1}^{short} G_p g_{r,q,n'} \text{Re}[K^*_{n'',\sigma}(\vec{x}_p)\varphi_\sigma(\vec{x}_p-\vec{x}_r)]$$

If one next multiplies the G and K maps together on an element-wise basis, the summation over p in the second line of eq. [A.40] essentially becomes a discrete correlation operation, which can be carried out with near-linear scaling by using FFTs. More specifically, as a next sub-step in evaluating eq. [A.39], we calculate gradient component maps F that are defined as $$F_{\sigma,r} \equiv \sum_p \text{Re}[U_{p,\sigma}\varphi_\sigma(\vec{x}_p-\vec{x}_r)]$$ [A.41]

with $$U_{p,\sigma} \equiv \sum_{n''=1}^{short} G_p K^*_{n'',\sigma}(\vec{x}_p)$$

where we have taken advantage of the fact that G is real-valued. Calculation of the F gradient component maps (preferably by FFT) constitutes the second sub-step 2604 in FIG. 26.

At this point it becomes possible to complete the calculation of the optical contributions to the AL gradient, as the third sub-step 2606 in FIG. 26. To these gradient elements should be added as a fourth sub-step 2608 the contribution from mask manufacturability constraints, which may be obtained with near-linear scaling using the method described in U.S. Publication No. US 2013/0019211 A1.

More specifically, if we combine eq. [A.41] with eq. [A.40], we have that the block #3 optical contributions to the gradient elements are given by $$\frac{\partial AL}{\partial e_q} = \sum_r^{short} \left[ \left( \sum_{n'=1}^{short} g_{r,q,n'} \right) \left( \sum_\sigma^L F_{\sigma,r} \right) \right]$$ [A.42]

Figure 30:
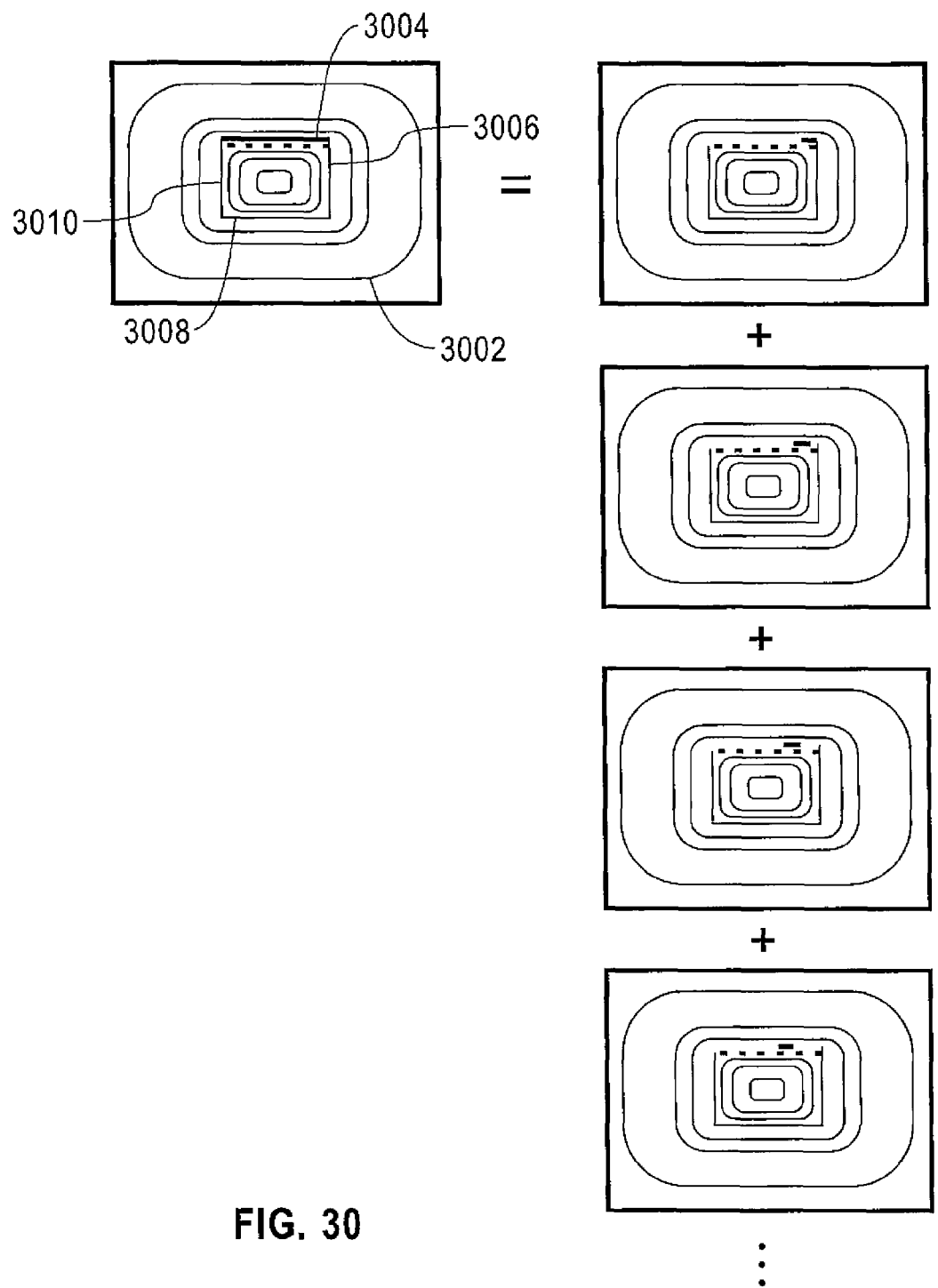
FIG. 30 shows schematically how gradient calculations can be staged for efficiency, with Fast Fourier Transforms being used to calculate a gradient map which is then locally integrated along each mask edge.

The outer r summation in eq. [A.42] amounts to an integration along an edge that has been reduced to a summation over the edge-neighboring gridpoints within a coarsely rendered bitmap of the AL gradient (with this gradient bitmap being the sum of the F maps). Eq. [A.42] thus achieves near-linear scaling as the endpoint of a staged calculation, in which maps F of the gradient contributions are first obtained on a grid of points by using FFTs, and then the individual gradient elements are obtained by short-range integrations within the summed maps. More specifically, the r summand in eq. [A.42] uses interpolation to approximate the integration along edge q of the differential change in the AL that would be introduced by a differential excursion of an infinitesimally short edge fragment that might conceptually be introduced locally at some point along edge q, and the total sum over r then represents the total differential change in the AL that would be provided by a shift in the position of the entire edge. This is illustrated in FIG. 30, which shows schematically with contours 3002 a map of the derivative of the AL with respect to a small incremental insertion of mask content. The r summand of eq. [A.42] is essentially the interpolated discretized content of this map at a sequence of positions along an edge q of the mask features. In the FIG. 30 schematic example the qth edge is the upper edge 3004 of the rectangular mask object whose other edges are edges 3006, 3008, 3010. The derivative of the AL with respect to $e_q$ is the differential change in the AL that results from a differential upward motion of edge q, and this is indicated schematically in the left column of FIG. 30 by a small shift of the upper edge from the position shown dashed to the position shown with a solid line 3004. It follows that the AL derivative is the integral of the gradient map along the upper edge. As shown schematically by the right column, this integral is essentially the sum of the gradient map contributions at successive points along the edge. In the most elementary embodiment the terms of the r sum in eq. [A.42] could simply be a sampling of the gradient map, but preferably a more accurate set of quadrature weights g is used.

To each gradient element should next be added the manufacturability contribution, and the gradient vector should then be extended to include the derivatives with respect to any auxiliary variables that may have been used, e.g. the w' and w" auxiliary variables. All sums in eq. [A.42] have fixed range, and since the total number of edges scales linearly with mask area, the total computational burden in evaluating eq. [A.42] for all gradient elements achieves near-linear scaling.

Successive calculations of the AL and its gradient can be used during inner-loop steps to adjust the edge and auxiliary variables in such a way as to drive the AL to a maximum, for example by using the methods described in the above-referenced work of Bertsekas.

Once the AL has been maximized, edges that are shorter than a threshold may be deleted, in order to reduce mask complexity (and therefore mask write time), with the two edges that each deleted edge formerly connected being subsequently joined together into a single new edge. We refer to the length-cutoff for edge deletion as a deletion threshold.

The eq. [A.42] integrated gradient will be zero along every entire edge when the AL is maximized, but each integrated edge gradient will generally consist of balancing positive and negative parts along the edge that individually have non-zero magnitude. After AL maximization, those edges whose largest contiguous positive or negative gradient sections exceed a certain threshold in magnitude may each be split into a pair of edges by insertion of a new orthoedge, whose length may initially be set equal to the deletion threshold. The threshold that is applied to the magnitude of the contiguous integrated gradient parts is referred to as an orthoedge insertion threshold, or simply as an insertion threshold. More precisely, the magnitude of the totals to either side of a zero-crossing in the gradient along each edge may be compared to the orthoedge insertion threshold to decide whether a new orthoedge should be inserted at the zero-crossing point. The insertion and deletion thresholds may be changed during the outer loops of the optimization flow, and may be made to depend on the current mean edge density.

If the number of edges is changed at the end of an inner loop maximization sequence, the AL should preferably be re-maximized. When maximization and re-maximization loops are completed the penalty parameters $\lambda$ and $\mu$ can be adjusted in the outer loop, for example using procedures described by Bertsekas. Once the objective has been maximized without constraint violation and with valid multipliers $\lambda$, the $e_q$ and w variables will essentially maximize the standard (non-augmented) Lagrangian, and an optimum solution will have been attained. The total number of inner and outer loop steps may be regarded as being of roughly fixed magnitude, with a typical total iteration count being in the range of 20 to 200. Each step in the FIG. 24 sequence that is carried out during one of these iterations exhibits near-linear scaling, and thus, near-linear scaling is achieved for the total solution time.

What is claimed is:

1. A method comprising:
    selecting a mask blank for lithographically forming a desired pattern of main features to be printed onto a wafer by projection lithography;
    identifying first locations in said desired pattern, said first locations being those which would produce on said wafer images impacted by phase distortions of actinic light through openings in said desired pattern;
    identifying second locations in said desired pattern for the insertion of orthoedges, said orthoedges being provided to contribute an additional amplitude of actinic light to said images impacted by phase distortions when said actinic light is projected onto said wafer;
    inserting said orthoedges into said desired pattern at said second locations at orientations such that said orthoedges provide a quadrature component to said additional amplitude of actinic light having an opposite sign to the quadrature component of the actinic light producing said phase distortions; and
    forming said mask blank lithographically with said desired pattern modified through the insertion of said orthoedges.

2. The method as claimed in claim 1, wherein the desired pattern includes an integrated circuit (IC) pattern.

3. The method as claimed in claim 1, wherein the desired pattern includes Sub-Resolution Assist Features (SRAFs), said SRAFs not producing printed images when said desired pattern is projected onto a wafer by actinic light.

4. The method as claimed in claim 3, wherein said orthoedges are included in said SRAFs.

5. The method as claimed in claim 4, wherein said SRAFs are elongated openings running adjacent and parallel to said main features of said desired pattern, and wherein said orthoedges extend across said SRAFs.

6. The method as claimed in claim 1, wherein said orthoedges are in said main features of said desired pattern.

7. The method as claimed in claim 1, wherein said phase distortions are induced by transmission of actinic light through said openings in said desired pattern.

8. The method as claimed in claim 1, wherein said openings are subwavelength in size.

9. The method as claimed in claim 1, wherein said orthoedges are designed to act with a globally scoped lens aberration aimed at EMF-mitigation.

10. The method as claimed in claim 1, wherein said orthoedges are designed to influence the depth within a photoresist film at which actinic light will focus.

11. An apparatus comprising:
    one or more processors; and
    one or more memories including computer program code, the one or more memories and the computer program code configured, with the one or more processors, to cause the apparatus to perform at least the following:
    selecting a mask blank for lithographically forming a desired pattern of main features to be printed onto a wafer by projection lithography;
    identifying first locations in said desired pattern, said first locations being those which would produce on said wafer images impacted by phase distortions of actinic light through openings in said desired pattern;
    identifying second locations in said desired pattern for the insertion of orthoedges, said orthoedges being provided to contribute an additional amplitude of actinic light to said images impacted by phase distortions when said actinic light is projected onto said wafer;
    inserting said orthoedges into said desired pattern at said second locations at orientations such that said orthoedges provide a quadrature component to said additional amplitude of actinic light having an opposite sign to the quadrature component of the actinic light producing said phase distortions; and
    forming said mask blank lithographically with said desired pattern modified through the insertion of said orthoedges.

12. The apparatus as claimed in claim 11, wherein the desired pattern includes an integrated circuit (IC) pattern.

13. The apparatus as claimed in claim 11, wherein the desired pattern includes Sub-Resolution Assist Features (SRAFs), said SRAFs not producing printed images when said desired pattern is projected onto a wafer by actinic light.

14. The apparatus as claimed in claim 13, wherein said orthoedges are included in said SRAFs.

15. The apparatus as claimed in claim 14, wherein said SRAFs are elongated openings running adjacent and parallel to said main features of said desired pattern, and wherein said orthoedges extend across said SRAFs.

16. The apparatus as claimed in claim 11, wherein said orthoedges are in said main features of said desired pattern.

17. The apparatus as claimed in claim 11, wherein said phase distortions are induced by transmission of actinic light through said openings in said desired pattern.

18. The apparatus as claimed in claim 11, wherein said openings are subwavelength in size.

19. The apparatus as claimed in claim 11, wherein said orthoedges are designed to act with a globally scoped lens aberration aimed at EMF-mitigation.

20. The apparatus as claimed in claim 11, wherein said orthoedges are designed to influence the depth within a photoresist film at which actinic light will focus.

21. A computer program product comprising a computer-readable storage medium bearing computer program code embodied therein for use with a computer, the computer program code comprising code for performing at least the following:
  selecting a mask blank for lithographically forming a desired pattern of main features to be printed onto a wafer by projection lithography;
  identifying first locations in said desired pattern, said first locations being those which would produce on said wafer images impacted by phase distortions of actinic light through openings in said desired pattern;
  identifying second locations in said desired pattern for the insertion of orthoedges, said orthoedges being provided to contribute an additional amplitude of actinic light to said images impacted by phase distortions when said actinic light is projected onto said wafer;
  inserting said orthoedges into said desired pattern at said second locations at orientations such that said orthoedges provide a quadrature component to said additional amplitude of actinic light having an opposite sign to the quadrature component of the actinic light producing said phase distortions; and
  forming said mask blank lithographically with said desired pattern modified through the insertion of said orthoedges.

22. The computer program product as claimed in claim 21, wherein the desired pattern includes an integrated circuit (IC) pattern.

23. The computer program product as claimed in claim 21, wherein the desired pattern includes Sub-Resolution Assist Features (SRAFs), said SRAFs not producing printed images when said desired pattern is projected onto a wafer by actinic light.

24. The computer program product as claimed in claim 23, wherein said orthoedges are included in said SRAFs.

25. The computer program product as claimed in claim 24, wherein said SRAFs are elongated openings running adjacent and parallel to said main features of said desired pattern, and wherein said orthoedges extend across said SRAFs.

26. The computer program product as claimed in claim 21, wherein said orthoedges are in said main features of said desired pattern.

27. The computer program product as claimed in claim 21, wherein said phase distortions are induced by transmission of actinic light through said openings in said desired pattern.

28. The computer program product as claimed in claim 21, wherein said openings are subwavelength in size.

29. The computer program product as claimed in claim 21, wherein said orthoedges are designed to act with a globally scoped lens aberration aimed at EMF-mitigation.

30. The computer program product as claimed in claim 21, wherein said orthoedges are designed to influence the depth within a photoresist film at which actinic light will focus.

31. A mask for use in lithographically forming a desired pattern of main features on a wafer by projection lithography, said mask comprising:
  a plurality of main features in the form of openings through which actinic light is directed during projection lithography, said openings having a plurality of first locations producing on said wafer images impacted by phase distortions of said actinic light,
  said openings further having a plurality of second locations with orthoedges, said orthoedges being provided to contribute an additional amplitude of actinic light to said images impacted by phase distortions, said orthoedges being at orientations providing a quadrature component to said additional amplitude of actinic light having an opposite sign to the quadrature component of the actinic light producing said phase distortions.

32. The mask as claimed in claim 31, wherein the desired pattern includes an integrated circuit (IC) pattern.

33. The mask as claimed in claim 31, wherein the desired pattern includes Sub-Resolution Assist Features (SRAFs), said SRAFs not producing printed images when said desired pattern is projected onto a wafer by actinic light.

34. The mask as claimed in claim 33, wherein said orthoedges are included in said SRAFs.

35. The mask as claimed in claim 34, wherein said SRAFs are elongated openings running adjacent and parallel to said main features of said desired pattern, and wherein said orthoedges extend across said SRAFs.

36. The mask as claimed in claim 31, wherein said orthoedges are in said main features of said desired pattern.

37. The mask as claimed in claim 31, wherein said phase distortions are induced by transmission of actinic light through said openings in said desired pattern.

38. The mask as claimed in claim 31, wherein said openings are subwavelength in size.

39. The mask as claimed in claim 31, wherein said orthoedges are designed to act with a globally scoped lens aberration aimed at EMF-mitigation.

40. The mask as claimed in claim 31, wherein said orthoedges are designed to influence the depth within a photoresist film at which actinic light will focus.

* * * * *